United States Patent
Hsu et al.

(10) Patent No.: US 11,594,477 B2
(45) Date of Patent: Feb. 28, 2023

(54) SEMICONDUCTOR PACKAGE AND METHOD OF MANUFACTURING SEMICONDUCTOR PACKAGE

(71) Applicant: Taiwan Semiconductor Manufacturing Company, Ltd., Hsinchu (TW)

(72) Inventors: Chia-Kuei Hsu, Hsinchu (TW); Ming-Chih Yew, Hsinchu (TW); Shu-Shen Yeh, Taoyuan (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/232,066

(22) Filed: Apr. 15, 2021

(65) Prior Publication Data
US 2022/0336334 A1    Oct. 20, 2022

(51) Int. Cl.
*H01L 23/48* (2006.01)
*H01L 23/498* (2006.01)
*H01L 23/31* (2006.01)
*H01L 21/48* (2006.01)
(Continued)

(52) U.S. Cl.
CPC .... *H01L 23/49822* (2013.01); *H01L 21/4857* (2013.01); *H01L 21/563* (2013.01); *H01L 23/3157* (2013.01); *H01L 24/16* (2013.01); *H01L 2224/16227* (2013.01)

(58) Field of Classification Search
CPC .......... H01L 23/49822; H01L 21/4857; H01L 21/563; H01L 23/3157; H01L 24/16; H01L 2224/16227
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| (Continued) | | | |

FOREIGN PATENT DOCUMENTS

TW          202105636          2/2021

OTHER PUBLICATIONS

"Office Action of Taiwan Counterpart Application", dated Aug. 22, 2022, p. 1-p. 4.

*Primary Examiner* — Nicholas J Tobergte
(74) *Attorney, Agent, or Firm* — JCIPRNET

(57) ABSTRACT

A semiconductor package includes an encapsulated semiconductor device and a redistribution structure. The encapsulated semiconductor device includes a semiconductor device encapsulated by an encapsulating material. The redistribution structure overlays the encapsulated semiconductor device and includes a plurality of vias and a redistribution line. The plurality of vias are located on different layers of the redistribution structure respectively and connected to one another through a plurality of conductive lines, wherein, from a top view, an angle greater than zero is included between adjacent two of the plurality of conductive lines. The redistribution line is disposed under the plurality of conductive lines and connects corresponding one of the plurality of vias and electrically connected to the semiconductor device through the plurality of vias.

20 Claims, 22 Drawing Sheets

(51) Int. Cl.
   *H01L 21/56*   (2006.01)
   *H01L 23/00*   (2006.01)

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2011/0309468 A1* | 12/2011 | Oh ...................... H01L 25/0657 |
| | | 438/109 |
| 2019/0259695 A1* | 8/2019 | Gandhi ............ G01R 31/31717 |
| 2019/0378809 A1* | 12/2019 | Chen ....................... H01L 25/18 |

\* cited by examiner

SEMICONDUCTOR PACKAGE AND METHOD OF MANUFACTURING SEMICONDUCTOR PACKAGE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
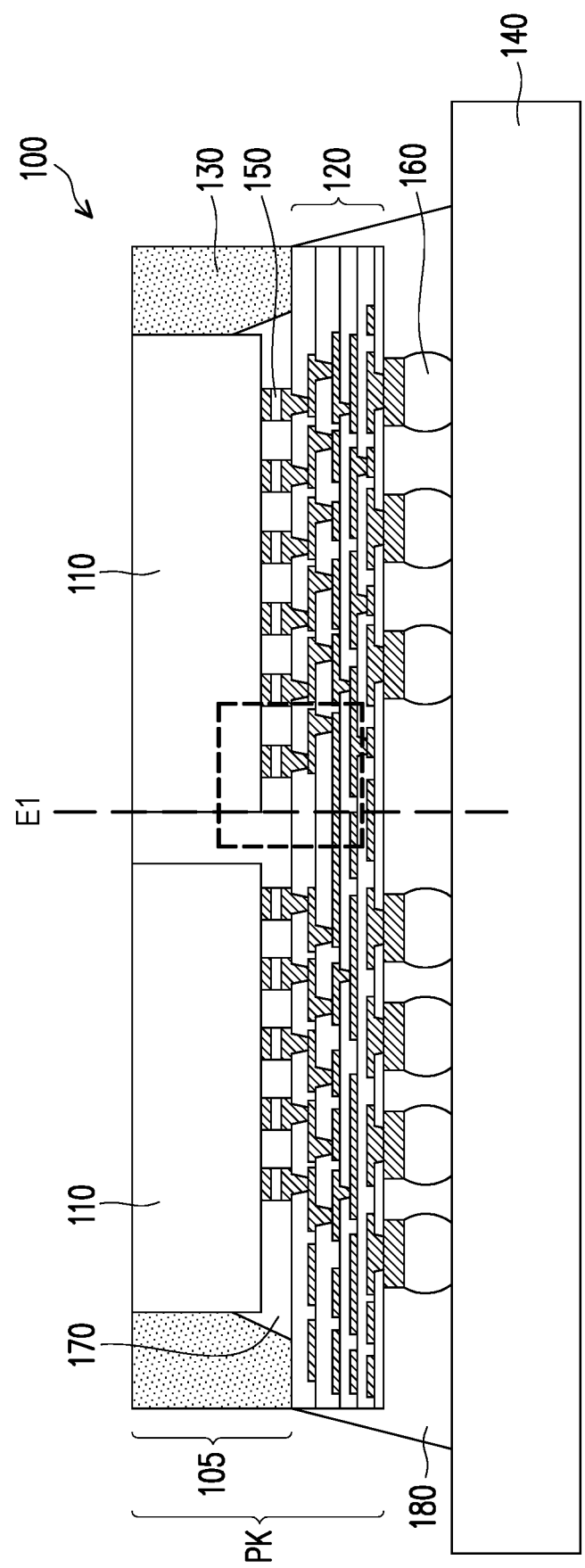
FIG. 1 illustrates a schematic cross sectional view of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package and the method of manufacturing a semiconductor package are provided in accordance with various exemplary embodiments. Before addressing the illustrated embodiments specifically, certain advantageous features and aspects of the present disclosed embodiments will be addressed generally. Described below is a semiconductor package including at least one semiconductor device bonded to a redistribution structure to form a package structure, and the package structure is then bonded to a substrate. In some embodiments, there may exist coefficient of thermal expansion (CTE) mismatch between the material typically used for the semiconductor device (e.g., silicon) and the material used for the substrate (e.g., Ajinomoto Build-up Film, ABF, glass fiber). The CTE mismatch between these materials may cause thermal stress in the redistribution structure, particularly during thermal cycling. For example, the different rates of expansion and contraction during changing temperatures between the semiconductor device and the substrate, caused by the CTE mismatch, creates stress on redistribution lines within the redistribution structure. The stress is particularly an issue for redistribution lines extending over a die edge (from a top view). In some embodiments, a plurality of vias are disposed on different layers of the redistribution structure respectively and connected to one another through a plurality of conductive lines, and an angle greater than zero is included between adjacent two of the plurality of conductive lines wherein from a top view. Accordingly, the redistribution line is connected to a bottommost one of the vias. Thereby, during the thermal cycling, certain thermal stress between the redistribution line and the semiconductor device may be released through the change of the angle between the conductive lines, and additional layers of dielectric layers (added for forming the at least one vias) also provide more flexibility to the redistribution structure. The intermediate stages of forming the semiconductor package are illustrated in accordance with some embodiments. Some variations of some embodiments are discussed. Throughout the various views and illustrative embodiments, like reference numbers are used to designate like elements.

FIG. 1 illustrates a schematic cross sectional view of a semiconductor package according to some embodiments of the present disclosure. Referring to FIG. 1, in some embodiments, the semiconductor package 100 may include an encapsulated semiconductor device 105 and a redistribution structure 120. The encapsulated semiconductor device 105 includes at least one semiconductor device 110 encapsulated by an encapsulating material 130. In the present embodiment, two semiconductor devices 110 are illustrated herein, more or less semiconductor devices 110 may be applied in the semiconductor package 100. The disclosure is not limited thereto. In some embodiments, the semiconductor devices 110 may include logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), transceiver (TRX) dies, the like, or a combination thereof. In addition, in some embodiments, the semiconductor devices 110 may be in different sizes (e.g., different heights and/or surface areas), and in other embodiments, the semiconductor devices 110 may be in the same size (e.g., same heights and/or surface areas). In some embodiments, one of the semiconductor devices 110 may be a logic die, such as a system on chip (SOC), a system on integrated chip (SoIC), application specific integrated circuit (ASIC), or the like. One of the semiconductor devices 110 may be a memory die, such as a DRAM die, SRAM die, or the like.

In some embodiments, the semiconductor devices 110 may be encapsulated by the encapsulating material 130. In some embodiments, the encapsulating material 130 at least laterally encapsulates the semiconductor devices 110. The encapsulating material 130 may include a molding compound, an epoxy, or a resin, etc. In some embodiments, a top surface of the encapsulating material 130 may be coplanar with back surfaces of the semiconductor devices 110. That is, the encapsulating material 130 may reveal the back surfaces of the semiconductor devices 110, which may achieved by a grinding process, for example. In an alternative embodiments, a top surface of the encapsulating material 130 may be higher than back surfaces of the semiconductor devices 110. Namely, the encapsulating material 130 covers the back surfaces of the semiconductor devices 110.

Figure 2:
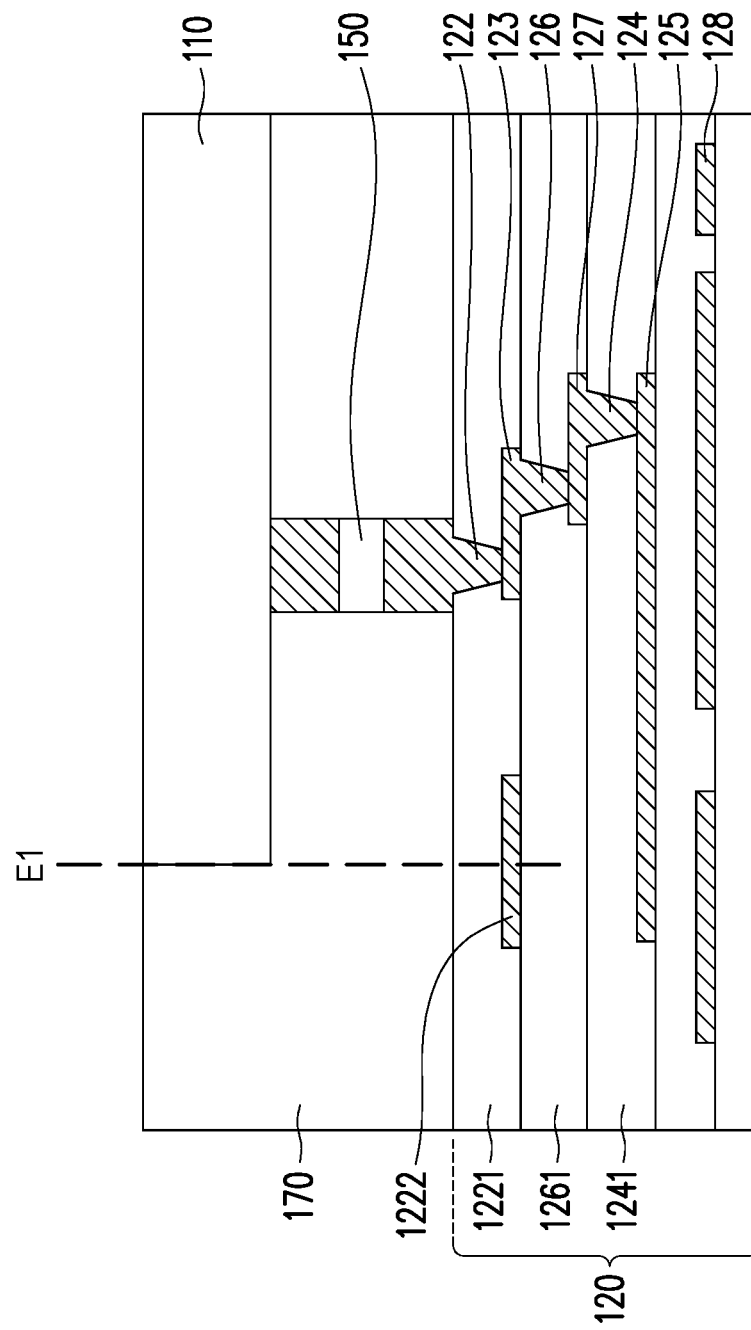
FIG. 2 illustrates a partial enlarged view of a semiconductor package according to some embodiments of the present disclosure.
Figure 3:
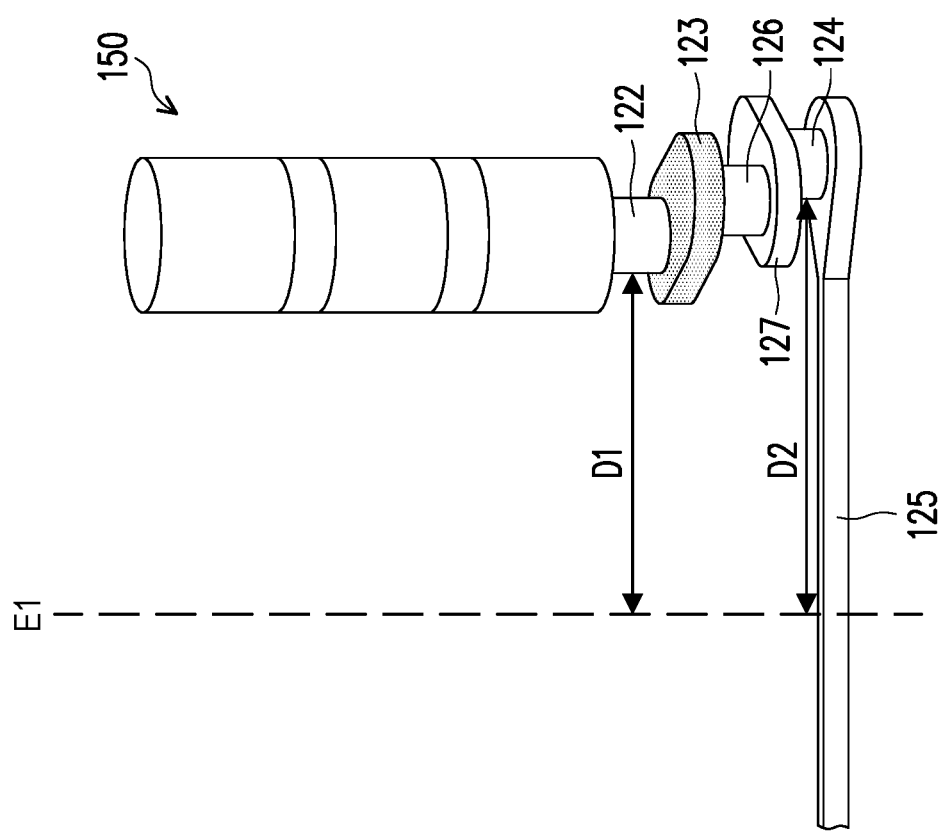
FIG. 3 illustrates a perspective view of a part of a semiconductor package according to some embodiments of the present disclosure.

FIG. 2 illustrates a partial enlarged view of a semiconductor package according to some embodiments of the present disclosure. FIG. 3 illustrates a perspective view of a part of a semiconductor package according to some embodiments of the present disclosure. Referring to FIG. 1 to FIG. 3, in some embodiments, a redistribution structure 120 overlays the encapsulated semiconductor device 105 to be electrically connected to the semiconductor devices 110. In some embodiments, the semiconductor device 105 may be bonded to the redistribution structure 120 through a plurality of conductive bump 150 by flip chip bonding technique. In some embodiments, the conductive bump 150 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. In the present embodiment, conductive bump 150 may be micro bumps, but the disclosure is not limited thereto. In other embodiments, the redistribution structure 120 may be formed over the encapsulated semiconductor device 105 without the bonding of the conductive bumps 150.

The redistribution structure 120 may be formed by, for example, depositing conductive layers, patterning the conductive layers to form a plurality of redistribution lines (e.g., redistribution line 125), and at least one conductive line (e.g., conductive line 123, 127). The redistribution lines and the conductive lines are at least partially covered with dielectric layers (e.g., dielectric layers 1221, 1241, 1261 shown in FIG. 2) and the dielectric layers fill the gaps between the redistribution lines and the conductive lines. The vias (e.g., vias 122, 124, 126) are located on the layers of the redistribution structure 120 respectively and extending through the corresponding dielectric layers for interconnecting the redistribution lines and the conductive lines at different layers. The material of the redistribution lines and the conductive lines may include a metal or a metal alloy including aluminum, copper, tungsten, and/or alloys thereof. "dielectric" refers to material that is less conductive than metallic conductors such as silver, and can refer to transparent semiconducting materials, and insulators (including polymers). The dielectric layers may be formed of dielectric materials, which is less conductive than metallic conductors such as silver, and can refer to (transparent) semiconducting materials, and insulators (including polymers). For example, dielectric materials may include polymers, oxides, nitrides, carbides, carbon nitrides, combinations thereof, and/or multi-layers thereof. The redistribution lines and the conductive lines are formed in the dielectric layers and electrically connected to the semiconductor device 110.

Throughout the description, the combined structure including the semiconductor device 110, redistribution structure 120, and the encapsulating material 130 as shown in FIG. 1 is referred to as a package structure PK, which may have a wafer form in the manufacturing process. Accordingly, in the package structure PK, the semiconductor device 110 is encapsulated by the encapsulating material 130, and the redistribution structure 120 is disposed on a first side (upper side) of the encapsulating material 130.

In some embodiments, the package structure PK may be bonded to the substrate 140 through a plurality of connectors 160. In some embodiments, the connectors 160 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 160 may include a conductive material such as solder, copper, aluminum, gold, nickel, silver, palladium, tin, the like, or a combination thereof. In some embodiments, the connectors 160 include a eutectic material and may comprise a solder bump or a solder ball, as examples. In some embodiments, a reflow process may be performed, giving the connectors 160 a shape of a partial sphere in some embodiments. Alternatively, the connectors 160 may comprise other shapes. The connectors 160 may also comprise non-spherical conductive connectors, for example. In some embodiments, the connectors 160 include metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls. In the present embodiment, the connectors are C4 bumps, but the disclosure is not limited thereto.

In some embodiments, an underfill material 180 may be injected or otherwise formed in the space between the connectors 160 and redistribution structure 120. The underfill material 180 may, for example, comprise a liquid epoxy, non-conductive paste (NCP), non-conductive film (NCF), deformable gel, silicon rubber, or the like, that is dispensed between the connectors 160 and redistribution structure 120 and/or pre-laminated on the surface of substrate 140, and then cured to harden. This underfill material 180 is used, among other things, to reduce cracking and to protect the connectors 160.

In general, there may exist coefficient of thermal expansion (CTE) mismatch between different materials in the semiconductor package 100. The CTE mismatch between these materials may cause thermal stress in the redistribution structure 120. For example, the different rates of expansion and contraction during changing temperatures between the material typically used for the semiconductor device 110 (e.g., silicon) and the material typically used for the substrate (e.g., Ajinomoto Build-up Film (ABF), glass fiber), caused by the CTE mismatch, creates stress on redistribution lines (e.g., redistribution line 125) within the redistribution structure 120. Such stress may cause the redistribution lines (e.g., redistribution line 125) cracking, especially around the die edge E1 (e.g., corner and/or sides of the semiconductor device 110).

Accordingly, the redistribution structure 120 may include at least one conductive line (e.g., conductive lines 123, 127), a plurality of vias (e.g., vias 122, 124, 126), and at least one redistribution line (e.g., redistribution line 125) disposed under the conductive lines 123, 127. In some embodiments, the (first) via 122 is the uppermost vias that connects the semiconductor device 110, or the conductive bumps 150 on the semiconductor device 110). In some embodiments, the conductive bumps 150 are bonded between the semiconductor device 110 and the redistribution structure 120, and each of the conductive bumps 150 may include a solder layer 156 formed above a copper seed layer 152. An optional nickel layer 154 may be in between the solder bump 156 and the copper seed layer 152, but the disclosure is not limited thereto. More or less layers may be included in the conductive bump 150. The copper seed layer 152 and the nickel layer 154 may act as an UBM and a barrier layer for the formation of solder layer 156. The solder layer 156 may include an electrically conductive solder material, e.g., Sn, Ni, Au, Ag, Cu, Bi, W, Fe, Ferrite, an alloy or combination thereof, or any other suitable material. One of the conductive bumps 150 is bonded to the uppermost one of the vias (e.g., the via 122). As such, the via 122 connects the conductive bumps 150 and extends through the (uppermost) dielectric layer (e.g., the dielectric layer 1221 shown in FIG. 2) for connecting between the conductive bumps 150 on the semiconductor device 110 and the (first) conductive line 123.

In accordance with some embodiments of the disclosure, the metallization patterns within the redistribution structure 120 may include redistribution lines 125 (i.e., signal lines) (e.g., providing power, ground, and/or electrical routing to the semiconductor device 110) and conductive lines between and among the redistribution lines. In some embodiments, the term "conductive line" herein refers to conductive features included for reasons other than electrical routing. For example, in an embodiment, the conductive lines 123, 127 may be electrically insulated from other conductive features (circuits) in the package. In other embodiments, the conductive line 123 may be electrically connected to the redistribution lines 125 in other layers. However, in such embodiments, the conductive lines 123, 127 may not provide any electrical routing for the redistribution lines 125 within the layers in which the conductive lines 123, 127 are disposed.

In some embodiments, the vias 122, 124, 126 are located on different layers of the redistribution structure 120 respectively and connected to one another through the conductive lines 123, 127. For example, the (first) via 122 extends through the (uppermost) dielectric layer 1221 closest to the semiconductor device 110, the (second) via 124 extends through the (lower) dielectric layer 1241 furthest from the semiconductor device 110 and connecting the redistribution line 125. In addition, the (third) via 126 extends through the dielectric layer 1261 in the middle and is disposed between the vias 122 and 124. The redistribution line 125 is disposed under the (first) conductive line 123 and the (second) conductive line 127 and connected to corresponding one of the vias 124. In one embodiment, the conductive line 127 is disposed between the conductive line 123 and the redistribution line 125. Accordingly, the via 124 connects between the conductive line 123 and the redistribution line 125 while the via 126 connects between the conductive line 123 and the conductive line 127. In some embodiments, the conductive line 123 is configured for connecting the vias 122, 126 along its length direction (e.g., the length direction A1 shown in FIG. 4). In some embodiments, the via 122 and the via 126 are connected to two opposite ends of the conductive line 123 along its length direction, and the via 122 and the via 126 connect two opposite surfaces (upper surface and lower surface) of the conductive line 123 respectively. Similarly, the via 126 and the via 124 are connected to two opposite ends of the conductive line 127 along its length direction, and the via 126 and the via 1264 connect two opposite surfaces (upper surface and lower surface) of the conductive line 127 respectively. As such, the redistribution line 125 is electrically connected to the semiconductor device 110 through the vias 122, 124, 126 and the conductive lines 123 and 127. It is noted that other redistribution lines (e.g., redistribution line 1222) configured for providing power, ground, and/or electrical routing to the semiconductor device 110 may also be disposed on the same level (e.g., in the same dielectric layer 1221) with the conductive lines 123, 127.

Figure 4:
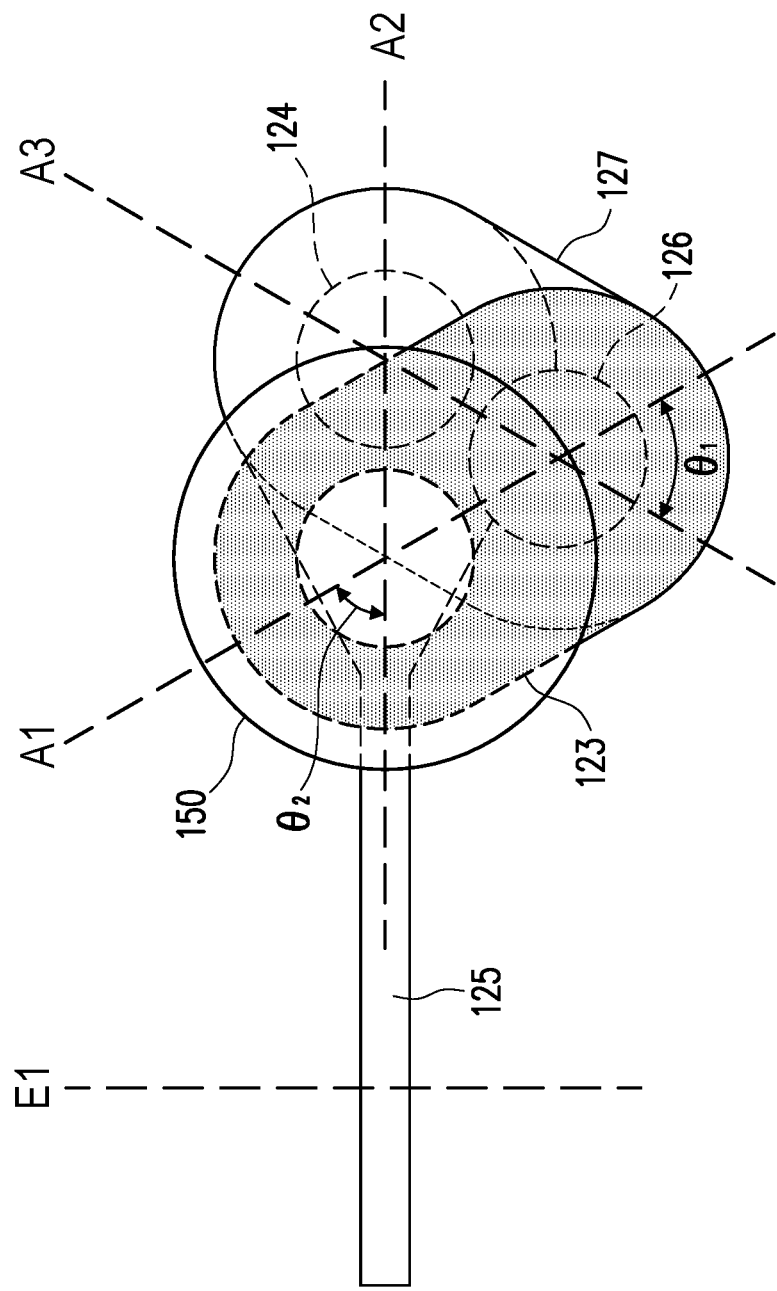
FIG. 4 illustrates a top view of the part of the semiconductor package shown in FIG. 3.
Figure 5:
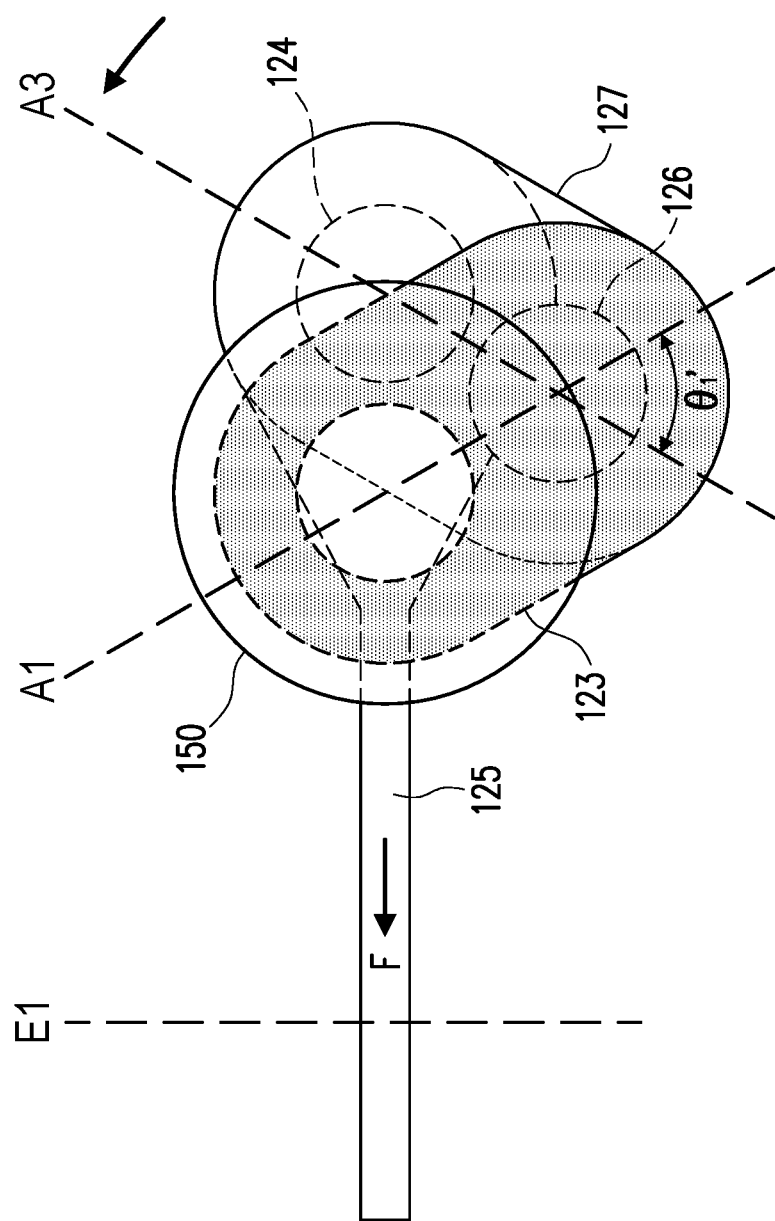
FIG. 5 illustrates a top view of the part of the semiconductor package shown in FIG. 4 after thermal expansion.

In accordance with some embodiments of the disclosure, referring to FIG. 4 and FIG. 5, an angle $\theta 1$ is included between adjacent two of the conductive lines 123, 127 from a top view, and the angle $\theta 1$ is greater than zero. For example, to measure from a top view, the angle $\theta 1$ greater than zero is included between a length direction A1 of the conductive line 123 and a length direction A3 of the conductive line 127. That is, the adjacent two of the conductive lines 123, 127 are not parallel to or collinear with one another. In one embodiment, the angle $\theta 1$ ranges from about 20 degrees to about 90 degrees. To be more specific, the angle $\theta 1$ is greater than or substantially equal to 20 degrees and is smaller than or substantially equal to 90 degrees. In the present embodiment, an angle $\theta 2$ may also be included between the redistribution line 125 and one of the conductive lines 123, 127, and the angle $\theta 2$ is greater than zero. That is, the redistribution line 125 is not parallel to or collinear with one of the conductive lines 123, 127. In some embodiments, the angle $\theta 1$ may be about 45 degrees. In some embodiments, angle $\theta 1$ may be less than about 90 degrees. In some embodiments, from a top view, the conductive lines 123, 127 are routed in a manner that they are non-perpendicular to the edge E1 of the semiconductor device 110. With such arrangement, compared to the conductive lines 123, 127 being parallel or collinear to one another, the angle $\theta 1$ may help to reduce stress on the redistribution line 125 during thermal cycling (heating process). Accordingly, such arrangement can help to increase reliability of the redistribution line 125.

In accordance with some embodiments of the disclosure, the conductive line 123 is configured for horizontally connecting the via 122 and via 126, and the conductive line 127 is configured for horizontally connecting the via 126 and via 124, so the widths of the conductive lines 123, 127 are greater than the diameters of the vias 122, 124, 126. For example, the ratio of the diameter D1 of the via 122/124/126 to the width W1 of the conductive line 123/127 is about 0.5 to 0.9 (i.e., 0.5<D1/W1<0.9). The ratio of the diameter D1 of the via 122/124/126 to the length L1 of the conductive line 123/127 is about 0.3 to 0.9 (i.e., 0.3<D1/L1<0.9). In addition, the sizes of the conductive bumps 150 may be greater than the diameter of the vias 122, 124, 126. For example, the ratio of the diameter D2 of the via 122 (may be the same as diameter D1) to the diameter D3 of the conductive bump 150 is about 0.5 to 0.7 (i.e., 0.5<D3/D2<0.7). Moreover, the widths of the conductive lines 123, 127 are greater than the width of the redistribution line 125, which is configured for providing power, ground, and/or electrical routing to the semiconductor device 110.

In accordance with some embodiments of the disclosure, during a heating process, expansion rate of the material used for substrate 140 is generally greater than expansion rate of the material used for (a substrate of) the semiconductor device 110. Accordingly, the redistribution line 125 closer to the substrate 140 suffers from a tensile force F pulling toward the edge E1 of the semiconductor device 110 with respect to the via 124 interconnecting the semiconductor device 110. With the arrangement of the angle θ1 included between the conductive lines 123, 127, the angle θ1 may change (e.g., decrease) during the thermal expansion, which releases some of the stress concentrated on the redistribution line 125. For example, after the thermal expansion caused by heating process, the angle θ1 included between the conductive lines 123 and 127 may changes from the angle θ1 shown in FIG. 4 to the angle θ1' shown in FIG. 5, wherein the angle θ1' is substantially smaller than the angle θ1. The stress on the redistribution line 125 may transmit through and distribute over the vias 124, conductive line 127, the via 126, the conductive line 123, and the via 122. Accordingly, such arrangement may help to reduce stress on the redistribution line 125 during thermal cycling (heating process), and increase reliability of the redistribution line 125.

In one embodiment, the conductive bump 150 that is bonded to the via 122 is the one closest to the edge E1 of the semiconductor device 110. That is, the arrangement of the angle θ1 included between the conductive lines 123 and 127 may be applied to the via 122 that is bonded to the conductive bump 150 closest to the edge E1 since the stress is more severe around the edge E1. In other embodiment, the arrangement of the angle θ1 included between the adjacent conductive lines may be applied to each of the vias that is bonded to each of the conductive bumps 150.

With such arrangement, the stress on the redistribution line may transmit through and distribute over the vias 122, 124, 126, and the conductive lines 123, 127. In other words, during the thermal cycling, certain thermal stress between the redistribution line and the semiconductor device may be released through the change of the angle θ/θ1 between the conductive lines. Moreover, additional layers of dielectric layers (added for forming the at least one vias) also provide more flexibility to the redistribution structure. Thereby, such arrangement may help to reduce stress on the redistribution line during thermal cycling (heating process), and increase reliability of the redistribution line of a semiconductor package.

In accordance with some embodiments of the disclosure, referring back to FIG. 3, as discussed before, the stress is particularly an issue for redistribution lines 125 extending over the edge E1 or extending over a gap between two semiconductor devices 110 (from a top view). Accordingly, in some embodiments, a shortest horizontal distance D1 between (uppermost) one of the vias (e.g., the via 122) that is bonded to the semiconductor device 110 and a closest edge E1 of the semiconductor device 110 is shorter than a shortest horizontal distance D2 between (bottommost) one of the vias 124 that connects the redistribution line and the closest edge E1, wherein the closest edge E1 is the edge of the semiconductor device 110 that is closest to the via 122. In other words, the via 124 that connects the redistribution line 125 is arranged further away from the edge E1 than the via 122 is, so as to further reduce the stress on the redistribution line 125 and increase reliability of the redistribution line 125. In one of the implementations, the vias 122, 124, 126 do not overlap with one another from a top view.

In addition, an additional layer (e.g., including via 126, conductive line 127, dielectric layer 1261) is added to the redistribution structure 120, which provides another layer of buffer since the material of the dielectric layer (e.g., polymer) provides more flexibility, so as to further relieve the stress on the redistribution line 125. Accordingly, with the arrangement described above, the stress level on the redistribution line 125 may be reduced about 10% or more. That is, compared to a normalized stress level of 1 when there is no angle included between the conductive lines (if any) and the redistribution lines (when the angle θ, θ1 is 0 degrees), to when the angle included between the conductive lines is between 20 degrees to 90 degrees, the stress level may be reduced to about 0.9 or less.

Figure 6:
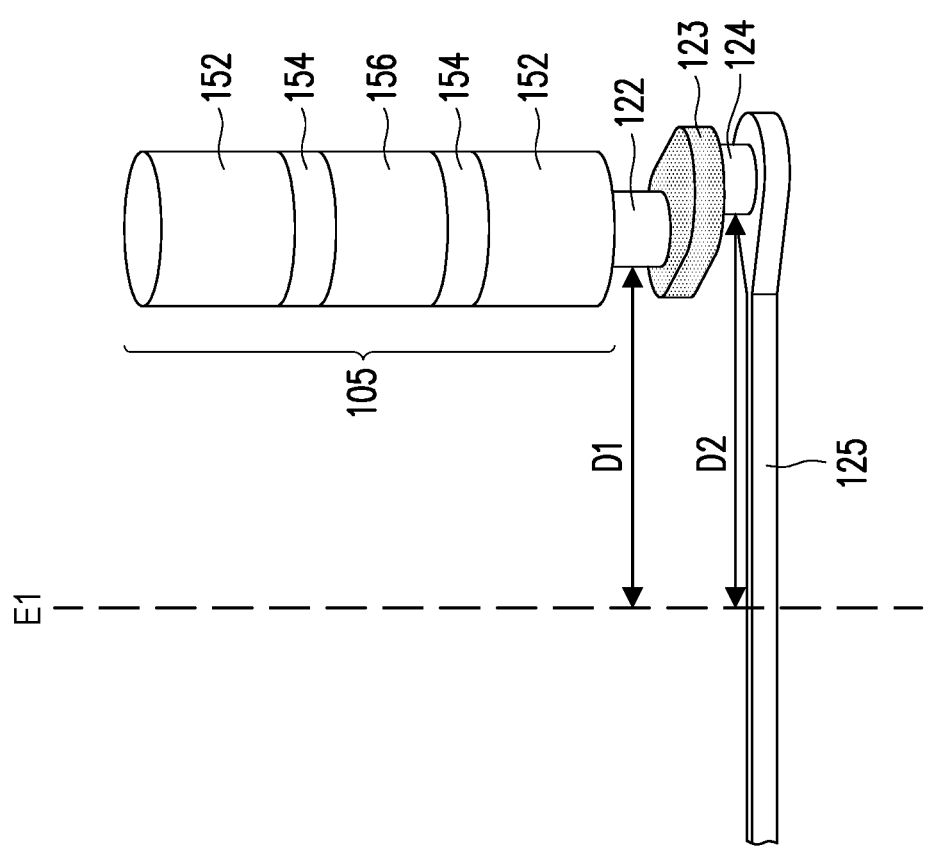
FIG. 6 illustrates a perspective view of a part of a semiconductor package according to some embodiments of the present disclosure.
Figure 7:
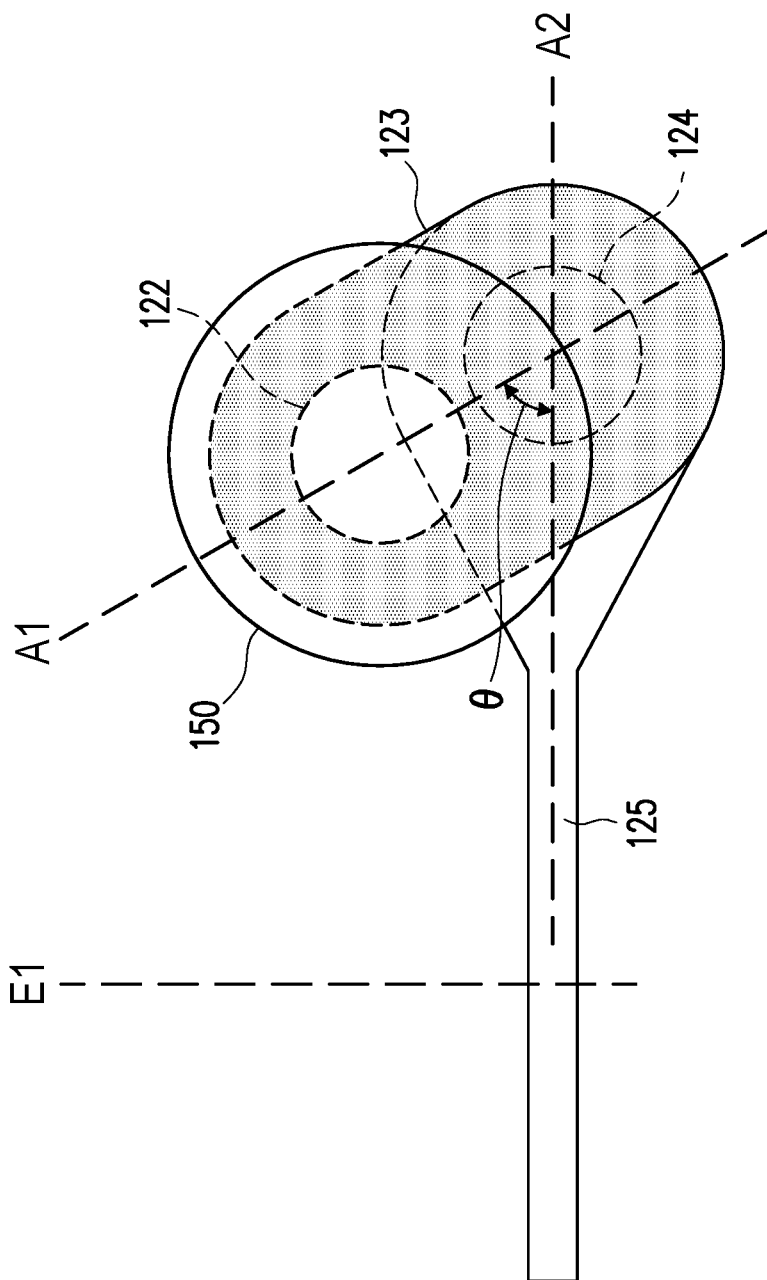
FIG. 7 illustrates a top view of the part of the semiconductor package shown in FIG. 6.
Figure 8:
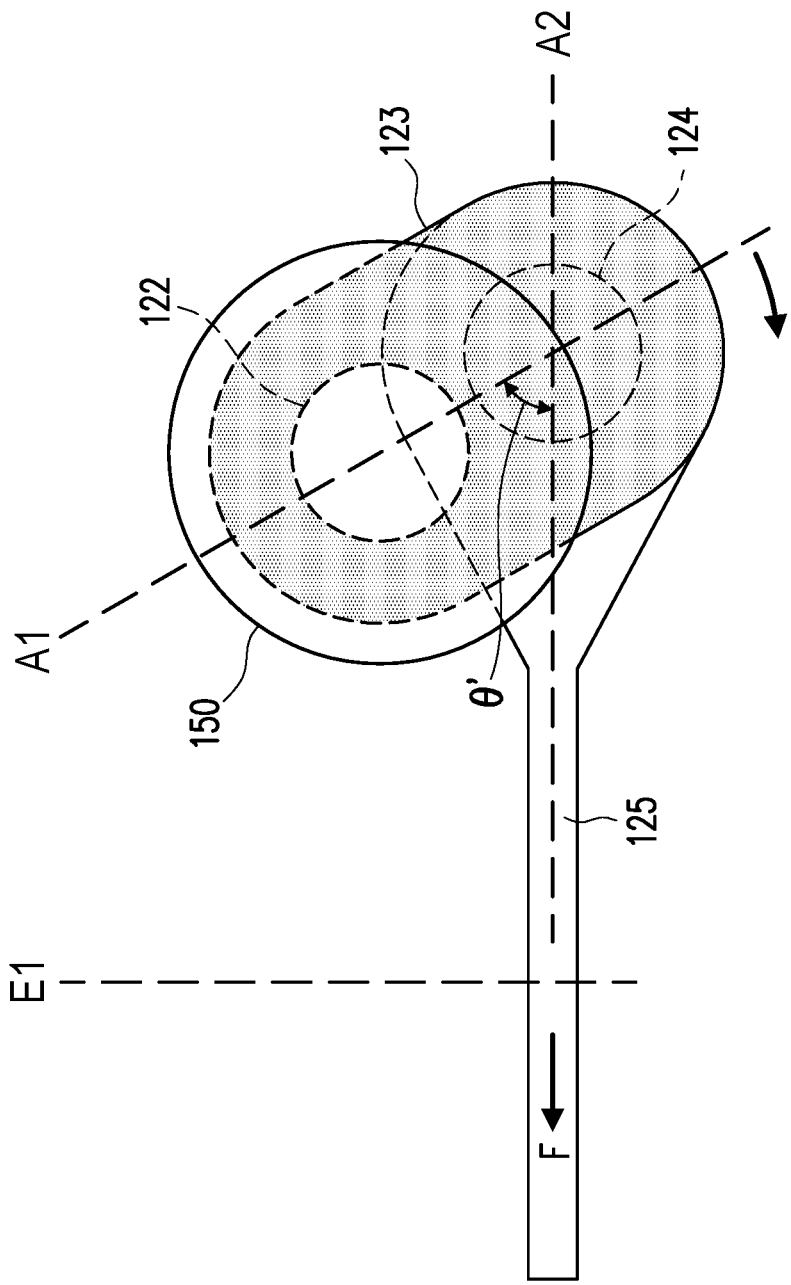
FIG. 8 illustrates a top view of the part of the semiconductor package shown in FIG. 7 after thermal expansion.

FIG. 6 illustrates a perspective view of a part of a semiconductor package according to some embodiments of the present disclosure. FIG. 7 illustrates a top view of the part of the semiconductor package shown in FIG. 6. FIG. 8 illustrates a top view of the part of the semiconductor package shown in FIG. 7 after thermal expansion. It is noted that the semiconductor package shown in FIG. 6 to FIG. 8 contains many features same as or similar to the semiconductor package disclosed earlier with FIG. 1 to FIG. 5. For purpose of clarity and simplicity, detail description of same or similar features may be omitted, and the same or similar reference numbers denote the same or like components. The main differences between the semiconductor package shown in FIG. 6 to FIG. 8 and the semiconductor package disclosed earlier with FIG. 1 to FIG. 5 are described as follows.

In some embodiments, the redistribution structure 120 may include at least one conductive line (e.g., dummy line 123), a plurality of vias (e.g., vias 122, 124), and at least one redistribution line (e.g., redistribution line 125). In some embodiments, the (first) via 122 is the uppermost vias that connects the semiconductor device 110, or the conductive bumps 150 on the semiconductor device 110).

In some embodiments, the (second) via 124 is located below the (first) via 122 and connects between the conductive line 123 and the redistribution line 125. In other words, the vias 122 and 124 are located on different (dielectric) layers of the redistribution structure 120 respectively and connected to one another through the conductive line 123. In accordance with some embodiments of the disclosure, the metallization patterns within the redistribution structure 120 may include redistribution lines 125 (i.e., signal lines) (e.g., providing power, ground, and/or electrical routing to the semiconductor device 110) and conductive lines between and among the redistribution lines. In some embodiments, the conductive line 123 may be electrically insulated from other conductive features (circuits) in the package. In other embodiments, the conductive line 123 may be electrically connected to the redistribution lines 125 in other layers. However, in such embodiments, the conductive line 123 may not provide any electrical routing for the redistribution lines 125 within the layer in which the conductive line 123 is disposed. In some embodiments, the conductive line 123 is configured for connecting the vias 122, 124 along its length direction (e.g., the length direction A1 shown in FIG. 3). In other words, the via 122 and the via 124 are connected to two opposite ends of the conductive line 123 along its length direction, and the via 122 and the via 124 connect two opposite surfaces (upper surface and lower surface) of the conductive line 123 respectively. It is noted that other redistribution lines (e.g., redistribution line 1222) configured for providing power, ground, and/or electrical routing to the semiconductor device 110 may also be disposed on the same level (e.g., in the same dielectric layer 1221) with the conductive line 123 Referring to FIG. 6 to FIG. 8, in some embodiments, from a top view, an included angle θ is included between the conductive line 123 and the redistribution line 125, and the included angle θ is greater than zero. For example, to measure from a top view, the included angle θ greater than zero is included between a length direction A1 of the conductive line 123 and a length direction A2 of the redistribution line 125. In other words, the conductive line 123 and the redistribution line 125 are not parallel or collinear to each other. In one embodiment, the conductive bump 150 that is bonded to the via 122 is the one closest to the edge E1 of the semiconductor device 110. That is, the arrangement of the angle θ included between the conductive line 123 and the redistribution line 125 may be applied to the via 122 that is bonded to the conductive bump 150 closest to the edge E1 of the semiconductor device 110 since the stress is more severe around the edge E1. In other embodiment, the arrangement of the angle θ included between the conductive line and the redistribution line may be applied to each of the vias that is connected to each of the conductive bumps 150.

In some embodiments, the included angle θ is greater than about 15 degrees, and in some embodiments angle θ may be about 45 degrees. In some embodiments, angle θ may be less than about 90 degrees. In some embodiments, from a top view, the conductive line 123 is routed in a manner that it is non-perpendicular to the edge E1 of the semiconductor device 110. With such arrangement, compared to the conductive line 123 and the redistribution line 125 being parallel or collinear to each other, the included angle θ may help to reduce stress on the redistribution line 125 during thermal cycling (heating process). Accordingly, such arrangement can help to increase reliability of the redistribution line 125.

In accordance with some embodiments of the disclosure, during a heating process, expansion rate of the material used for substrate 140 is generally greater than expansion rate of the material used for (a substrate of) the semiconductor device 110. Accordingly, the redistribution line 125 closer to the substrate 140 suffers from a tensile force F pulling toward the edge E1 of the semiconductor device 110 with respect to the via 124 interconnecting the semiconductor device 110. With the arrangement of the angle θ included between the conductive line 123 and the redistribution line 125, the angle θ may change (e.g., increase) during the thermal expansion, which releases some of the stress concentrated on the redistribution line 125. For example, after the thermal expansion caused by heating process, the angle θ included between the conductive line 123 and the redistribution line 125 may changes from the angle θ shown in FIG. 7 to the angle θ' shown in FIG. 8, wherein the angle θ' is substantially greater than the angle θ. The stress on the redistribution line 125 may transmit through and distribute over the vias 124, conductive line 123, and the via 122. Accordingly, such arrangement may help to reduce stress on the redistribution line 125 during thermal cycling (heating process), and increase reliability of the redistribution line 125.

In accordance with some embodiments of the disclosure, referring back to FIG. 6, as discussed before, the stress is particularly an issue for redistribution lines 125 extending over the edge E1 or extending over a gap between two semiconductor devices 110 (from a top view). Accordingly, in some embodiments, a shortest horizontal distance D1 between the via 122 and the edge E1 of the semiconductor device 110 closest to the via 122 is shorter than a shortest horizontal distance D2 between the via 124 and the edge E1. In other words, the via 124 that connects the redistribution line 125 is arranged further away from the edge E1 than the via 122 is, so as to further reduce the stress on the redistribution line 125 and increase reliability of the redistribution line 125. In one of the implementations, the vias 122, 124 do not overlap with one another from a top view.

Figure 9:
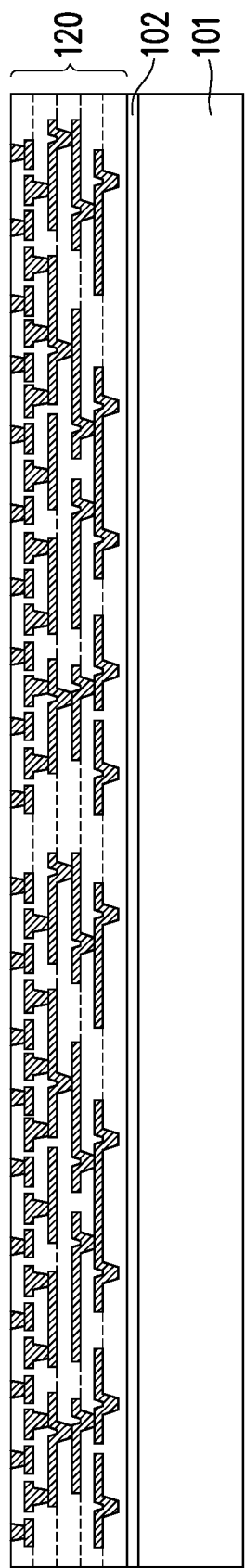
FIG. 9 to FIG. 19 illustrates a cross sectional views of intermediate stages in the manufacturing of a semiconductor package according to some embodiments of the present disclosure.

FIG. 9 to FIG. 19 illustrates a cross sectional views of intermediate stages in the manufacturing of a semiconductor package according to some embodiments of the present disclosure. One of the methods (processes) for manufacturing the semiconductor packages described above is illustrated as follows. Referring to FIG. 9, in some embodiments, a redistribution structure 120 described above is formed on a carrier 101. In some embodiments, the carrier 101 includes, for example, silicon based materials, such as glass or silicon oxide, or other materials, such as aluminum oxide, combinations of any of these materials, or the like. The carrier 101 is planar in order to form the redistribution structure 120 thereon and accommodate an attachment of semiconductor devices 110 (not illustrated in FIG. 9 but illustrated and described below with respect to FIG. 11). In some embodiments, an adhesive layer 102 may be placed on the carrier 101 in order to assist in the adherence of overlying structures (e.g., the redistribution structure 120). In an embodiment the adhesive layer 102 may include an ultra-violet glue, which loses its adhesive properties when exposed to ultra-violet light. However, other types of adhesives, such as pressure sensitive adhesives, radiation curable adhesives, epoxies, an Ajinomoto build-up film (ABF), combinations of these, or the like, may also be used. The adhesive layer 102 may be placed onto the carrier 101 in a semi-liquid or gel form, which is readily deformable under pressure.

With now reference to FIG. 5 and FIG. 9, the redistribution structure 120 is formed over the carrier 101 and the adhesive layer 102 (if any). In some embodiments, the redistribution structure 120 may be formed by depositing conductive layers, patterning the conductive layers to form a plurality of redistribution lines (e.g., redistribution lines 125, 128, 1222), and at least one conductive line (e.g., conductive lines 123, 127). The redistribution lines and the conductive lines are at least partially covered with dielectric layers (e.g., dielectric layers 1221, 1241, 1261 shown in FIG. 5) and the dielectric layers fill the gaps between the redistribution lines and the conductive lines. The vias (e.g., vias 122, 124, 126) are located on the layers of the redistribution structure 120 respectively and extending through the corresponding dielectric layers for interconnecting the redistribution lines and the conductive lines at different layers. The material of the redistribution lines and the conductive lines may include a metal or a metal alloy including aluminum, copper, tungsten, and/or alloys thereof.

In detail, a seed layer, such as a copper, titanium, or the like, may be deposited over the carrier 101, such as by sputtering or another physical vapor deposition (PVD) process. A photo resist is deposited on the seed layer and patterned to expose portions of the seed layer by photolithography. The pattern is for a metallization layer on the redistribution structure 120. Conductive material of the redistribution lines and the conductive lines, such as copper, aluminum, the like, or a combination thereof, is deposited on the exposed seed layer, such as by electroless plating, electroplating, or the like. The photoresist is removed by an ash and/or flush process. The exposed seed layer removed, such as by a wet or dry etch. The remaining conductive material forms a metallization layer (e.g., the redistribution lines 125, 128, 1222 and the conductive lines 123, 127 shown in FIG. 5) of the redistribution structure 120. A dielectric layer (e.g., dielectric layers 1221, 1241, 1261 shown in FIG. 5) is deposited over the metallization layer. The material of the dielectric layer may include polymer such as a polyimide, polybenzoxazole (PBO), benzocyclobutene (BCB), the like, or a combination thereof. The dielectric layer can be deposited by a coating process, a lamination process, the like, or a combination thereof. Vias (e.g., vias 122, 124, 126 shown in FIG. 5) may be formed through the dielectric layer to the metallization layer using acceptable photolithography techniques.

Subsequent metallization layers and dielectric layers may be formed using the same or similar processes as discussed. Conductive material deposited during the formation of a subsequent metallization layer may be deposited in openings of the previously formed dielectric layers to form vias for electrically connecting respective metallization layers. After forming the topmost dielectric layer 1221, via 122 is formed through the topmost dielectric layer 1221 for connectors coupled between the redistribution lines 125, and another semiconductor device, package, die, and/or another substrate. It should be noted that any number of metallization layers and dielectric layers may be formed, and the redistribution structure 120 in this embodiment is illustrated as an example.

As illustrated in FIG. 3 and FIG. 7, in some embodiments, the redistribution structure 120 includes the vias 122, 126, 124 connected to one another through the conductive lines 123, 127. In addition, from a top view, an angle θ is included between the conductive line 123 and the redistribution line 125, and the included angle θ is greater than zero. In other words, the conductive line 123 and the redistribution line 125 are not parallel or collinear to each other. In the embodiment of the redistribution structure 120 having multiple conductive lines for connecting the vias, an angle θ1 is included between adjacent two of the conductive lines 123, 127 from a top view, and the angle θ1 is greater than zero. That is, the adjacent two of the conductive lines 123, 127 are not parallel to or collinear with one another. In some embodiments, the angle θ1 ranges substantially from about 20 degrees to about 90 degrees.

Figure 10:
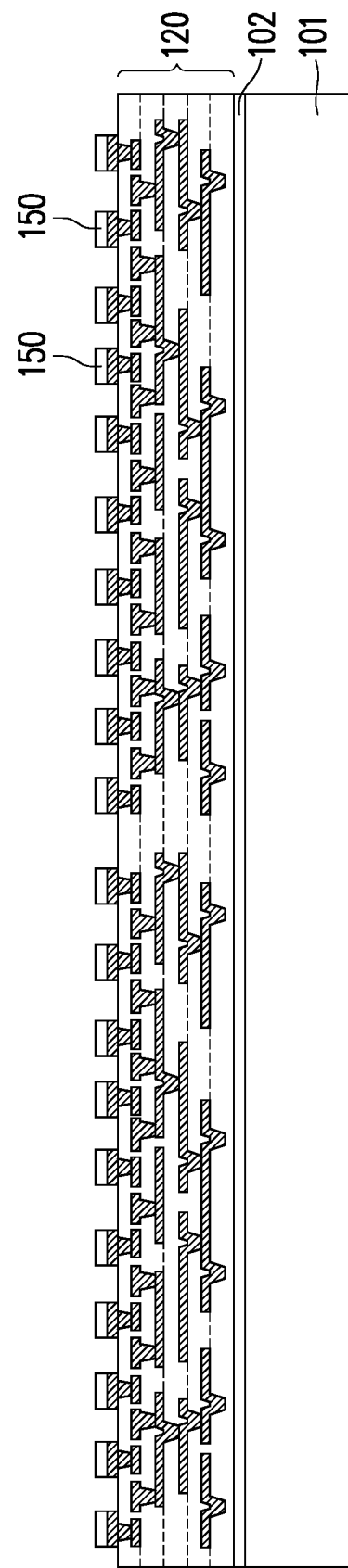

With now reference to FIG. 10, in some embodiments, after the redistribution structure 120 is formed, the conductive bumps 150 are provided over the redistribution structure 120. In some embodiments, the connectors 160 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. In the present embodiment, the conductive bumps are micro bumps, for example, and each of the conductive bumps 150 may include a solder layer formed above a copper seed layer. An optional nickel layer may be in between the solder layer and the copper seed layer. The copper seed layer and the nickel layer may act as an UBM and a barrier layer for the formation of solder layer. The solder layer may include an electrically conductive solder material, e.g., Sn, Ni, Au, Ag, Cu, Bi, W, Fe, Ferrite, an alloy or combination thereof, or any other suitable material. One of ordinary skill in the art will recognize that there are many suitable arrangements of materials and layers suitable for the formation of the conductive bumps 150. Any suitable materials or layers of material that may be used for the conductive bumps 150 are fully intended to be included within the scope of the current embodiments. The conductive bumps are bonded to the uppermost one of the vias (e.g., the via 122). As such, the via 122 connects the conductive bumps 150 and extends through the (uppermost) dielectric layer (e.g., the dielectric layer 1221 shown in FIG. 5) for connecting between the conductive bumps 150 and the conductive line 123.

Figure 11:
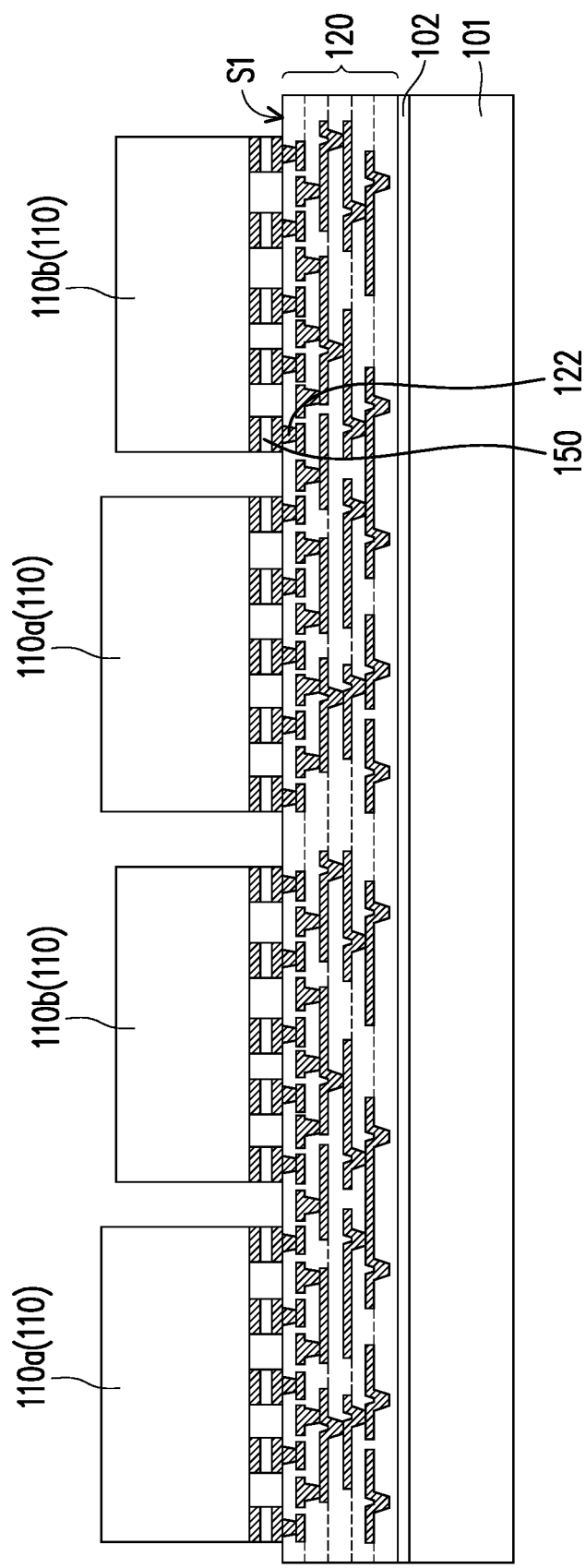

With now reference to FIG. 11, in some embodiments, at least one semiconductor device 110 is boned on a first side 51 of the redistribution structure 120, for example, through the conductive bumps 26 by flip-chip bonding technique. In some embodiments, more than one semiconductor devices 110 (e.g., two sets of the semiconductor devices 110a, 110b) may be placed on the conductive bumps 26 using, for example, a pick-and-place tool. In the present embodiment, two sets of the semiconductor devices 110a, 110b are illustrated herein, but more or less semiconductor devices 110 may be applied in the semiconductor package 100. The disclosure is not limited thereto. For example, in some embodiments, the semiconductor device 110a may be a logic die, such as a system on chip (SOC), a system on integrated chip (SoIC), application specific integrated circuit (ASIC), or the like. The semiconductor device 110b may be a memory die, such as a DRAM die, SRAM die, or the like. Other types of dies may also be adopted, such power management dies (e.g., power management integrated circuit (PMIC) dies), radio frequency (RF) dies, sensor dies, micro-electro-mechanical-system (MEMS) dies, signal processing dies (e.g., digital signal processing (DSP) die), front-end dies (e.g., analog front-end (AFE) dies), transceiver (TRX) dies, the like, or a combination thereof. In addition, the semiconductor devices 110a, 110b may be in different sizes (e.g., different heights and/or surface areas), and in other embodiments, the semiconductor devices 110 may be in the same size (e.g., same heights and/or surface areas). In an embodiment, the semiconductor devices 110 are bonded to the first side 51 of the redistribution structure 120 by a reflow process. During this reflow process, the conductive bumps 150 are in contact with the semiconductor devices 110, and the pads (UBM layer) of the redistribution structure 120 to physically and electrically couple the semiconductor devices 110 to the redistribution structure 120. Accordingly, the redistribution line 125 of the redistribution structure 120 is electrically connected to the semiconductor devices 110 through the vias 122, 124, and 126 and the conductive bumps 150.

Figure 12:
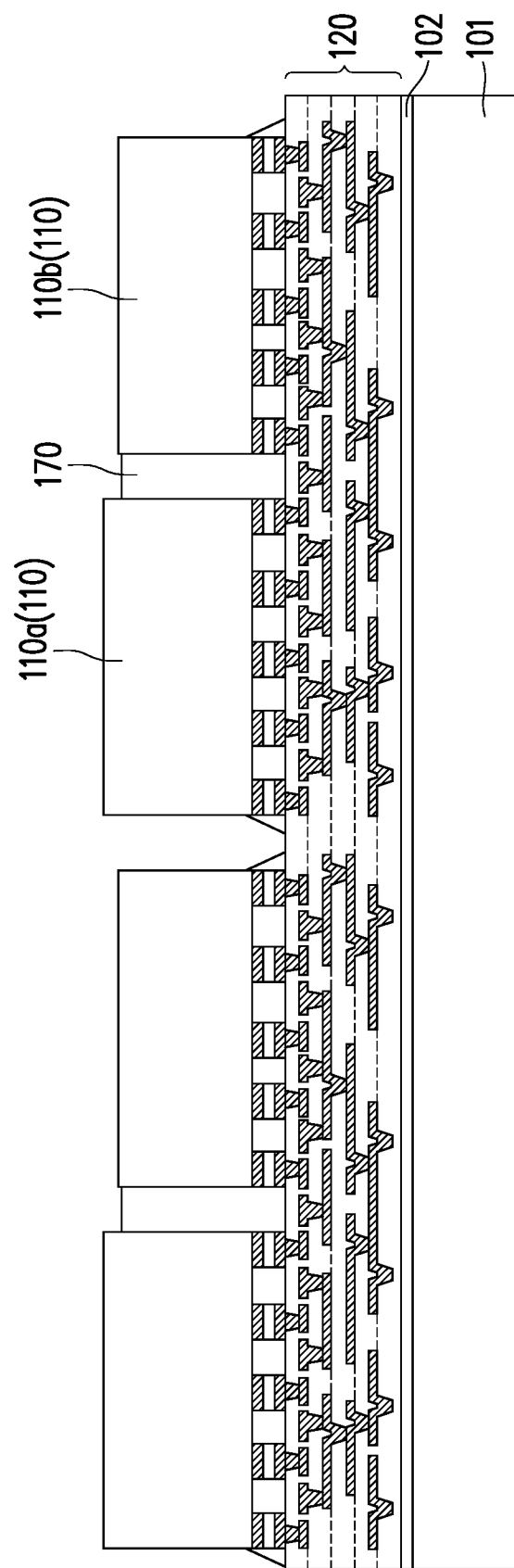

With now reference to FIG. 12, an underfill material 170 is optionally dispensed into the gaps between the semiconductor devices 110a and 110b, the redistribution structure 120, and surrounding the conductive bumps 150. In some embodiments, the underfill material 170 may extend up along sidewalls of the semiconductor devices 110a and 110b. The underfill material 170 may be any acceptable material, such as a polymer, epoxy, molding underfill, or the like. The underfill material 170 may be formed by a capillary flow process after the semiconductor devices 110a and 110b are bonded, or may be formed by a suitable deposition method before the semiconductor devices 110a and 110b are bonded.

Figure 13:
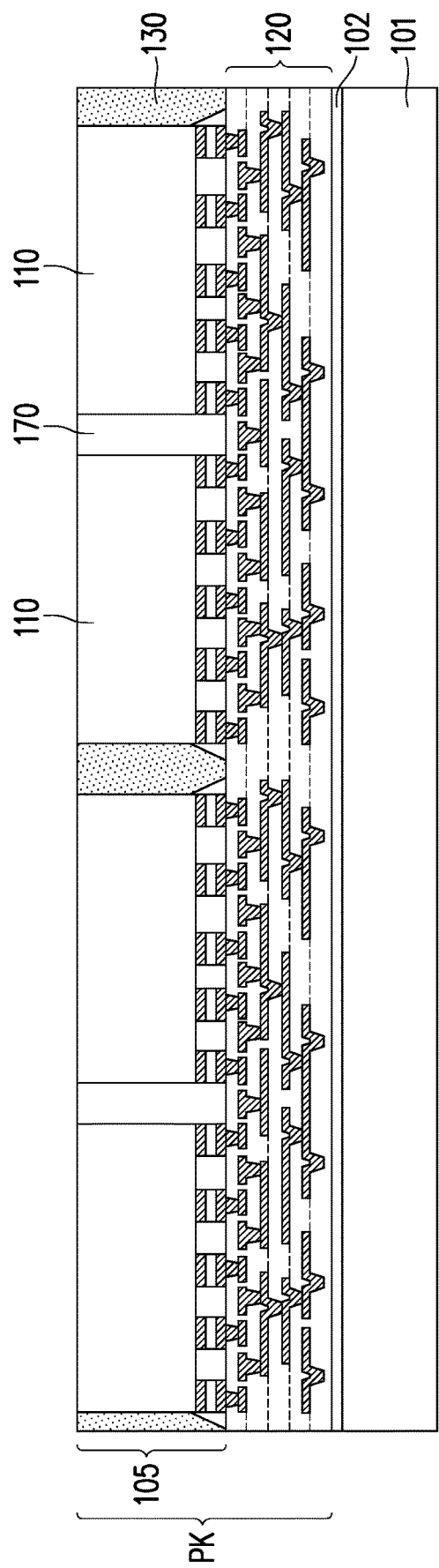

Referring to FIG. 13, an encapsulating material 130 is provided over the redistribution structure 120 to encapsulate the semiconductor devices 110 in accordance with some embodiments. Then, a thermal process is performed to set the encapsulating material 130. If the underfill material 170 is applied, the thermal process is also performed immediately afterwards to set the underfill material 170. The encapsulating material 130 may include a molding compound, an epoxy, or a resin, etc. In some embodiments, a top surface of the encapsulating material 130 may be higher than back surfaces of the semiconductor devices 110. Namely, the encapsulating material 130 covers the back surfaces of the semiconductor devices 110.

Then, a thinning process, which includes a grinding process, may be performed to thin the encapsulating material 130 (and the underfill material 170) until the back surfaces of the semiconductor devices 110 are revealed. The resulting structure is shown in FIG. 13. Due to the thinning process, the back surfaces of the semiconductor devices 110 are substantially level with the upper surfaces of the underfill material 170, and are substantially level with the upper surface of the encapsulating material 130 as shown in FIG. 13. Throughout the description, the resultant structure including the semiconductor devices 110 and the encapsulating material 130 as shown in FIG. 13 is referred to as an encapsulated semiconductor device 105, which may have a wafer form in the process. Accordingly, the resultant structure including the semiconductor devices 110, the encapsulating material 130, and the redistribution structure 120 as shown in FIG. 13 is referred to as a package structure PK, which may also have a wafer form in the process.

Figure 14:
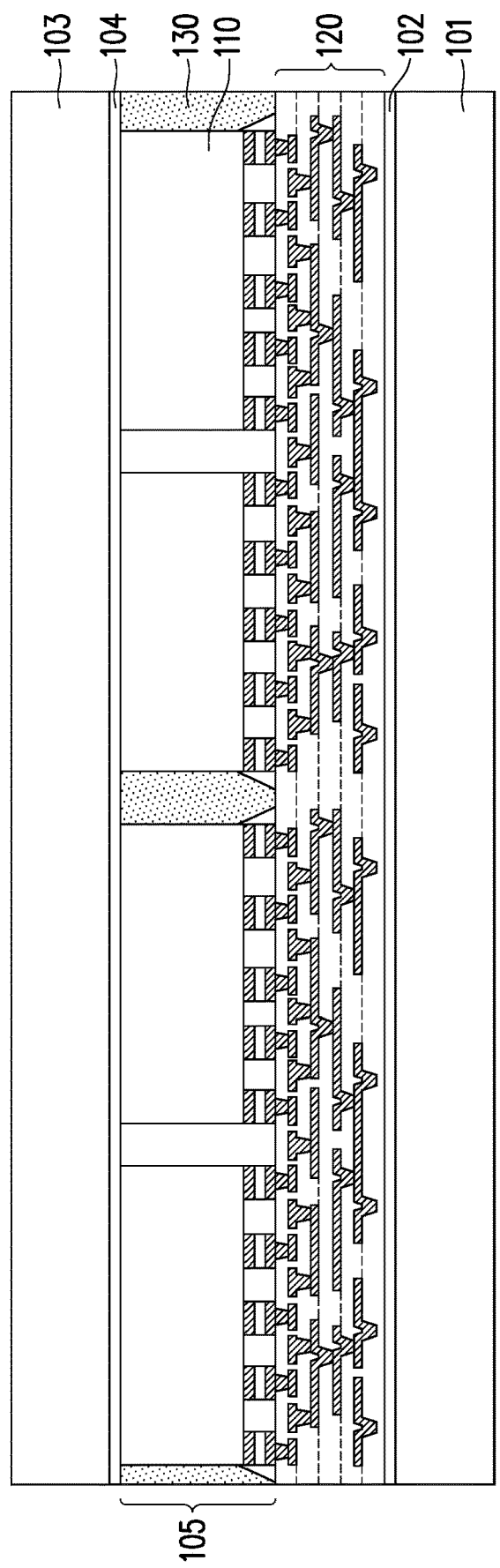
Figure 15:
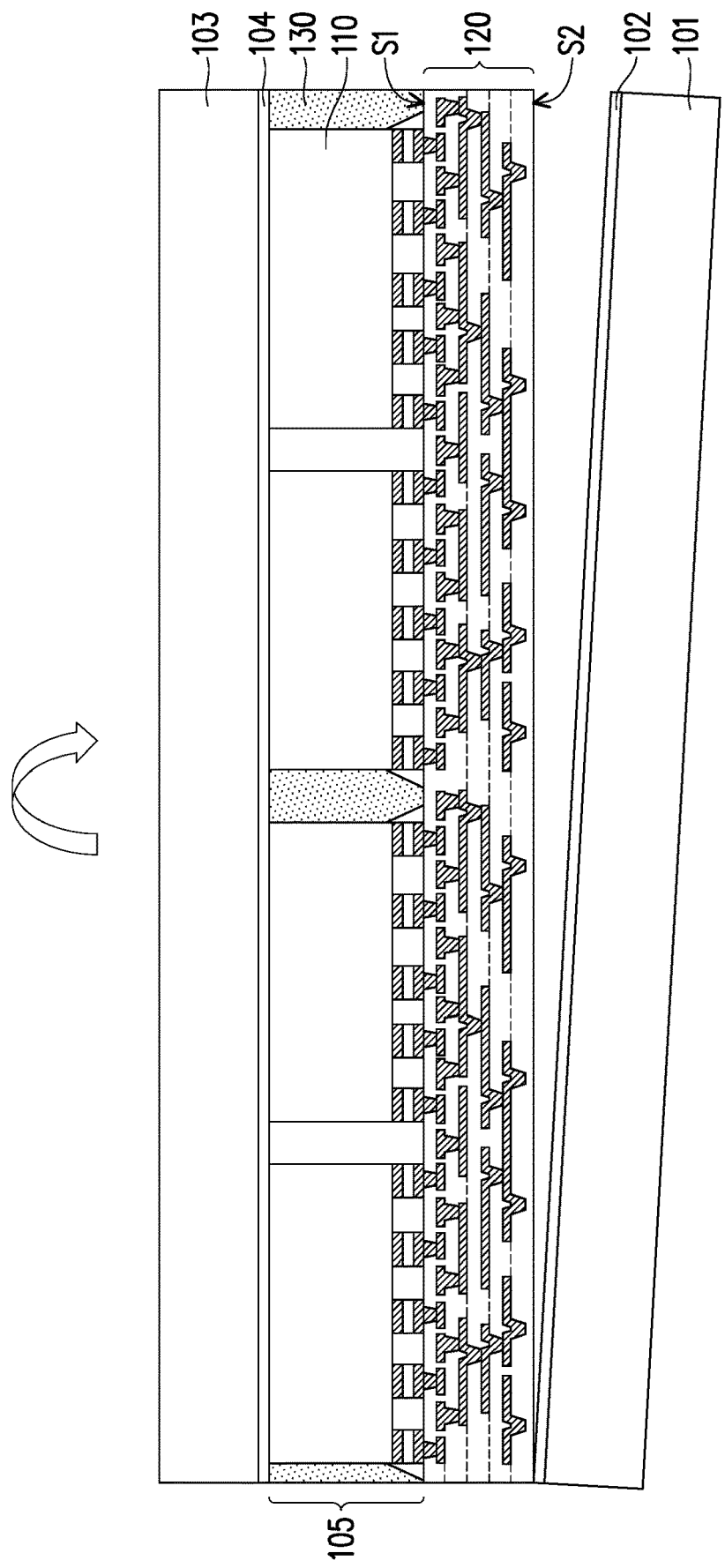

With now reference to FIG. 14 and FIG. 15, an upper side of the package structure PK is now temporarily attached to another carrier 103 by an adhesive layer 104 for supporting the package structure PK during subsequent processing. In some embodiments, the carrier 103 may be glass, ceramic, alumina, stainless steel or another material that provides adequate temporary support for the package structure PK during processing. A demounting step is performed to remove the carrier 101 from a second side S2 of the redistribution structure 120. In some embodiments, the carrier 101 is detached from the second side S2 of the redistribution structure 120 by causing the adhesive layer 102 to lose or reduce adhesion. The adhesive layer 102 is then removed along with the carrier 101. For example, the adhesive layer 102 may be exposed to UV light, so that the adhesive layer 102 loses or reduces adhesion, and hence the carrier 101 and the adhesive layer 102 can be removed from the second side S2 of the redistribution structure 120. It is noted that the orientation in the figures is shown for purposes of illustration only, and the process could be performed with the structure oriented in another direction.

Figure 16:
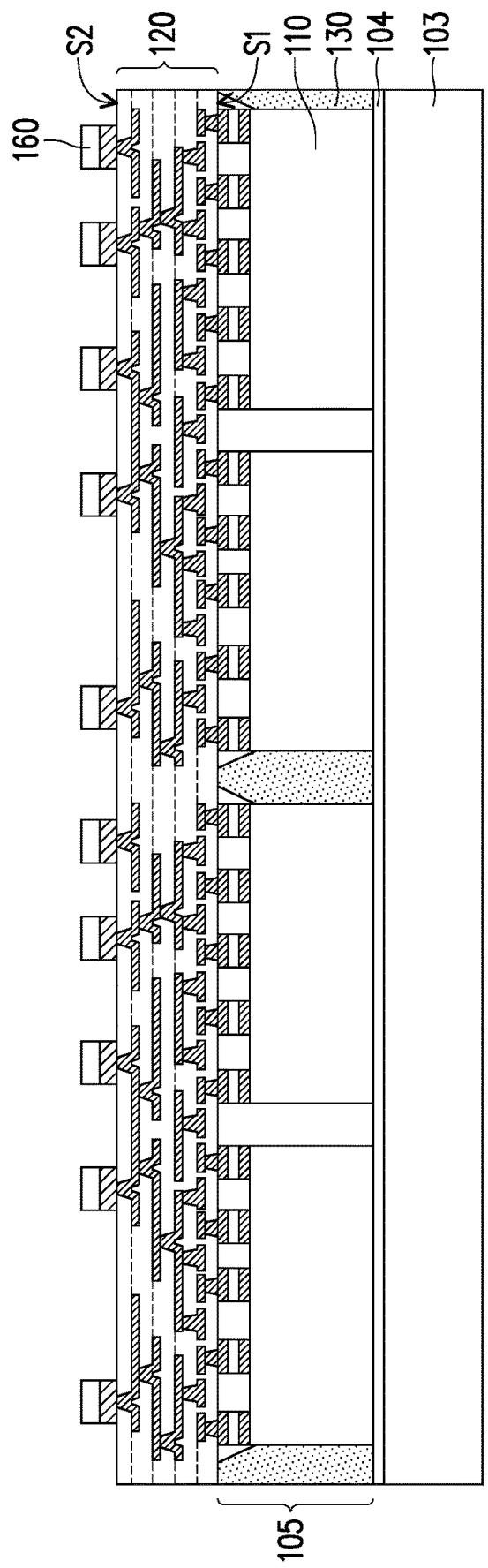

In FIG. 16, the orientation of the package structure PK is flipped, and the connectors 160 are provided over the second side S2 of the redistribution structure 120. Again, the orientation in the figures is shown for purposes of illustration only, and the process could be performed with the structure oriented in another direction. In some embodiments, the connectors 160 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 160 may include a conductive material such as solder, copper, aluminum, gold, nickel, silver, palladium, tin, the like, or a combination thereof. In some embodiments, the connectors 160 include a eutectic material and may comprise a solder bump or a solder ball, as examples. In some embodiments, a reflow process may be performed, giving the connectors 160 a shape of a partial sphere in some embodiments. Alternatively, the connectors 160 may comprise other shapes. The connectors 160 may also comprise non-spherical conductive connectors, for example. In some embodiments, the connectors 160 include metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls. In the present embodiment, the connectors are C4 bumps, but the disclosure is not limited thereto.

Figure 17:
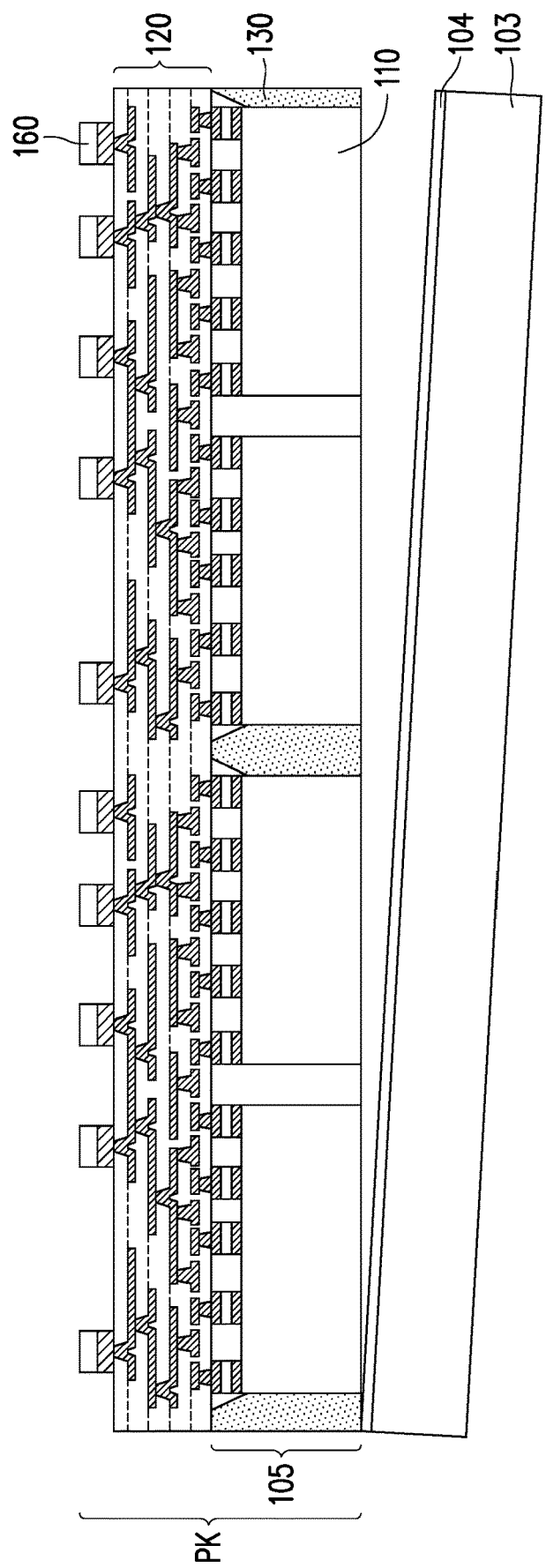

With now reference to FIG. 17, a demounting step is performed to remove the carrier 103 from the package structure PK. In some embodiments, the carrier 103 is detached from the package structure PK by causing the adhesive layer 104 to lose or reduce adhesion. The adhesive layer 104 is then removed along with the carrier 103. For example, the adhesive layer 104 may be exposed to UV light, so that the adhesive layer 104 loses or reduces adhesion, and hence the carrier 103 and the adhesive layer 104 can be removed from the package structure PK.

Figure 18:
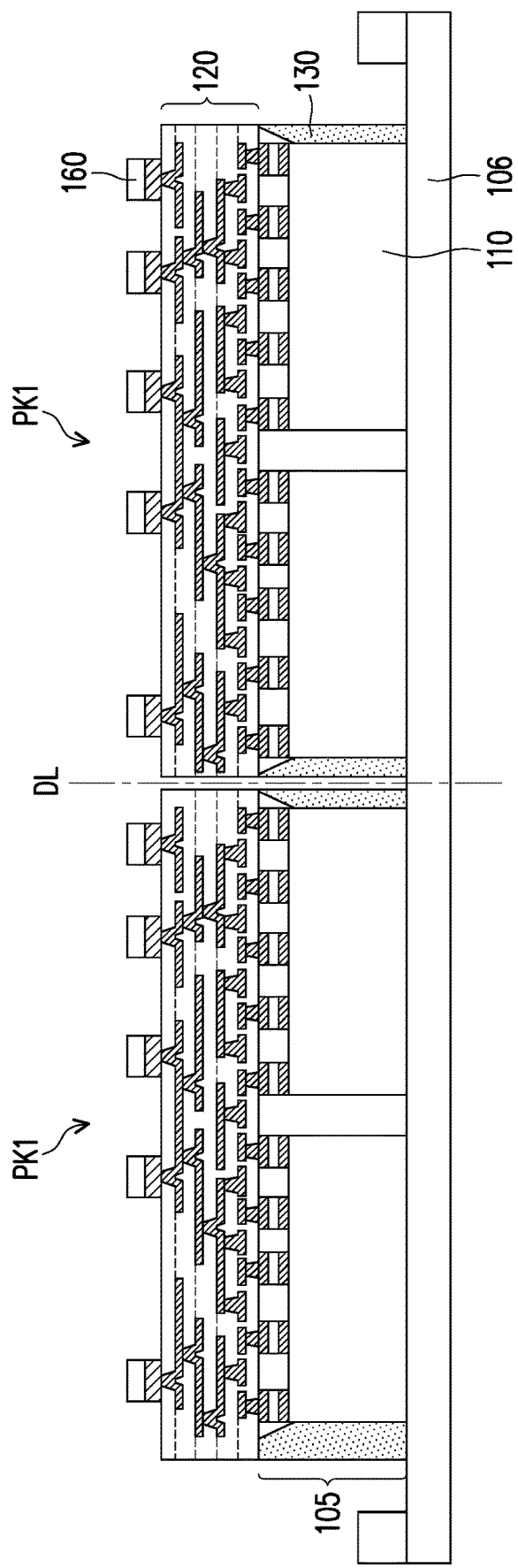

Referring to FIG. 17 and FIG. 18, the package structure PK may then be mounted (e.g. frame mounted) onto a dicing tape 106. Following this, package structure PK shown in FIG. 18 may be singulated or diced (e.g. along dicing line DL), thereby forming a plurality of packages PK1, each of which may be substantially identical to the package PK1 shown in FIG. 19.

Figure 19:
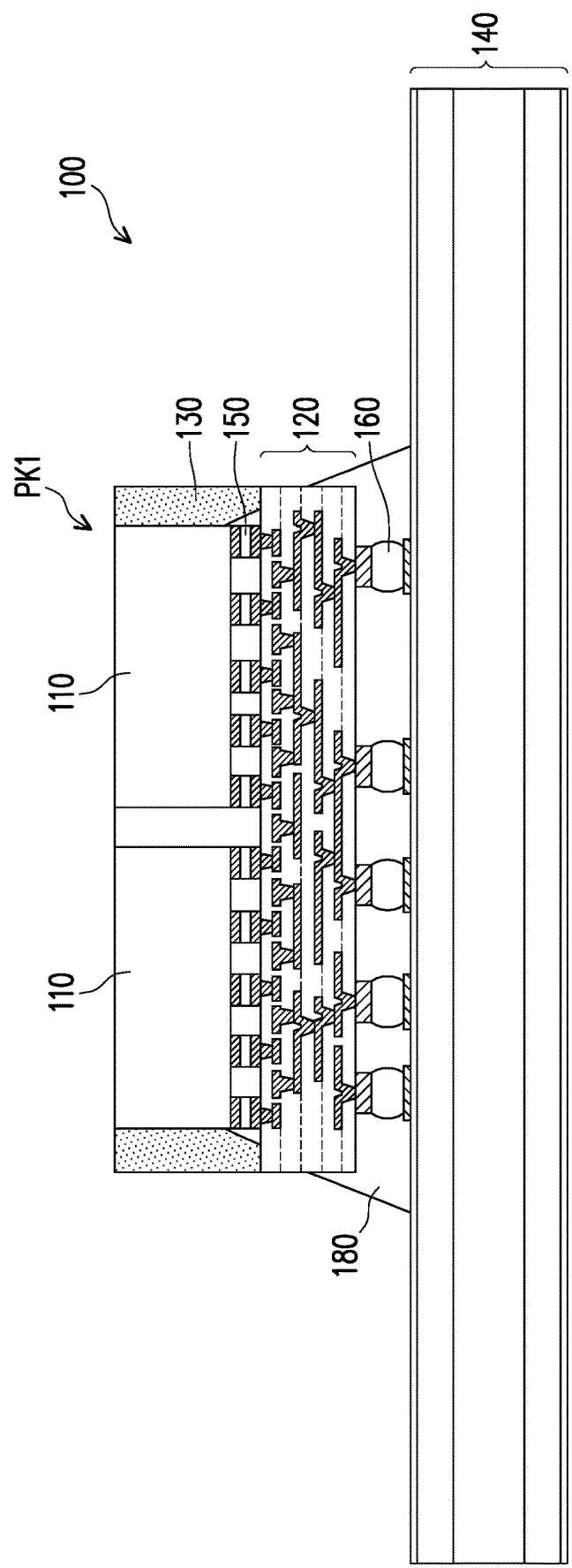

With now reference to FIG. 19, the package PK1 is bonded to a substrate 140 through the connectors 160. In some embodiments, the substrate 140 is boned to the second side S2 of the redistribution structure 120 of the diced package PK1, wherein the second side S2 is opposite to the first side S1 where the semiconductor device 110 is bonded. At this point, the semiconductor package 100 shown in FIG. 19 may be substantially formed. In some embodiments, the package PK1 is mounted by way of the connectors 160 to the substrate 140, which may be a package, a die, a PCB, a chip, or another surface. Additionally, while not shown, additional dies may be, in some embodiments, mounted on the substrate 140 and are in electrical communication with the package PK1 through the substrate 140. The substrate 140, in some embodiments, is based on an insulating core, such as a glass fiber reinforced resin core. An exemplary core material is glass fiber resin, such as FR4. Alternatives to the core material are bismaleimide-triazine (BT) resin or, alternatively, other printed circuit board (PCB) materials or layers. In addition, for the substrate 140, laminated layers such as an Ajinomoto make coat (ABF) or other laminates may be used. In an alternative embodiment, the substrate 140 may be made of a semiconductor material such as silicon, germanium, diamond or the like. In some embodiments, composite materials may also be used, such as silicon germanium, silicon carbide, gallium arsenic, indium arsenide, indium phosphide, silicon germanium carbide, gallium arsenic phosphide, gallium indium phosphide, combinations thereof, and the like. In addition, the substrate 140 can be a silicon on insulator substrate (SOI substrate). Typically, an SOI substrate comprises a layer of a semiconductor material, such as epitaxial silicon, germanium, silicon germanium, SOI, silicon germanium on insulator (SGOI), or combinations thereof.

Figure 20:
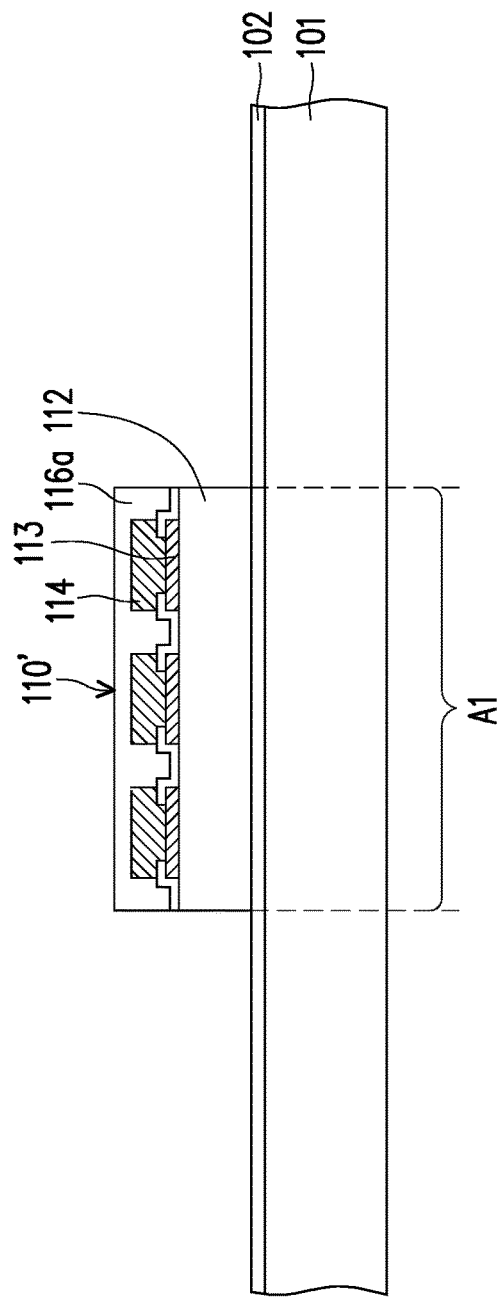
FIG. 20 to FIG. 24 illustrates a cross sectional views of intermediate stages in the manufacturing of a semiconductor package according to some embodiments of the present disclosure.

FIG. 20 to FIG. 24 illustrates a cross sectional views of intermediate stages in the manufacturing of a semiconductor package according to some embodiments of the present disclosure. The configuration of the redistribution structure 120 described above may also be applied to integrated fan-out (InFO) package to reduce the stress in the redistribution structure 120. Accordingly, another one of the methods (processes) for manufacturing the semiconductor package is illustrated as follows. Referring to FIG. 20, in some embodiments, a carrier 101 is provided, and an adhesive layer 102 may be disposed on the carrier 101. In some embodiments, the carrier 101 may be a glass carrier, a ceramic carrier, or the like. The adhesive layer 102 may be a light to heat conversion release coating (LTHC), or the like.

In addition, at least one semiconductor device 110 as shown in FIG. 20 is provided on the carrier 101. In some embodiments, the semiconductor device 110 may include logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), transceiver (TRX) dies, the like, or a combination thereof. Although one semiconductor device 110 is illustrated herein, more semiconductor devices may be placed over the carrier 101 and level with one another.

In some embodiments, the carrier 101 may include a plurality of die areas arranged in, for example, an array manner. Accordingly, a plurality of semiconductor devices 110 may be disposed on the die areas respectively. With such arrangement, a plurality of packages can be formed concurrently. For the sake of brevity and clarity, the manufacturing process of one of the packages is illustrated in FIG. 20 to FIG. 24. For example, one of the semiconductor devices 110 are illustrated in FIG. 20.

In some exemplary embodiments, a plurality of conductive vias 114 (such as copper vias) may be formed on an active surface (e.g. the top surface) of the semiconductor device 110 and electrically coupled to the pads 113 on the substrate 112 of the semiconductor device 110. In some embodiments, a dielectric layer 116a may be formed on the active surface (e.g. the top surface) of the semiconductor device 110, and may cover the top surfaces of the conductive vias 114. In other embodiments, the top surface of the dielectric layer 116a may be substantially level with the top surfaces of the conductive vias 114. Alternatively, the dielectric layer 116a may be omitted, and the conductive vias 114 protrude from the active surface of the semiconductor device 110.

Figure 21:
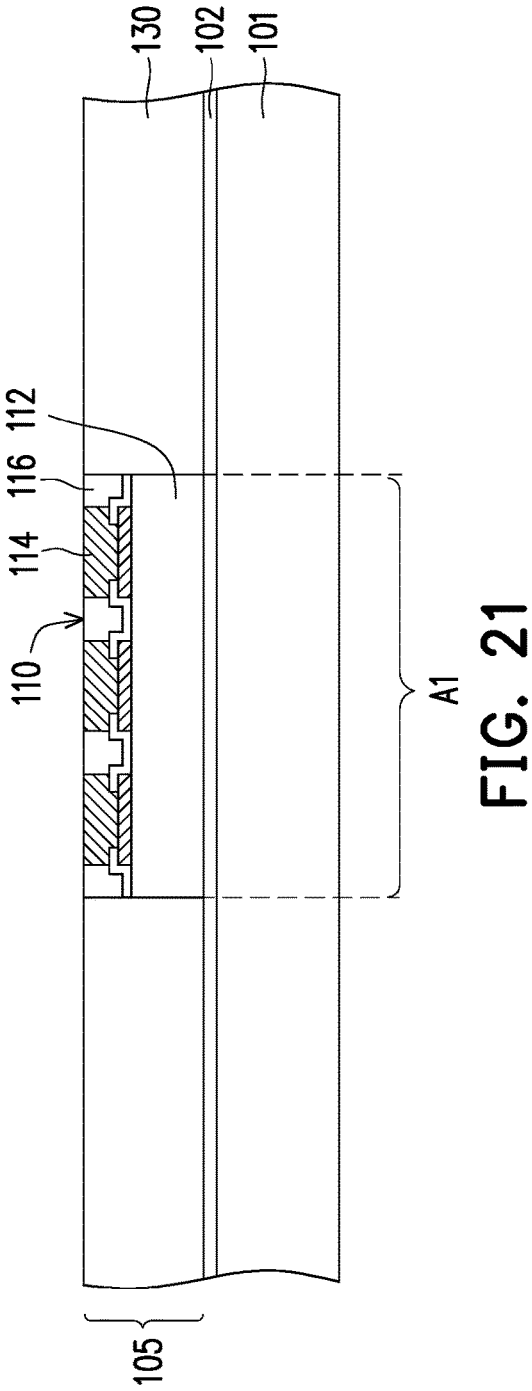

With now reference to FIG. 21, the semiconductor device 110 on the carrier 101 are encapsulated by the encapsulating material 130. In other words, the encapsulating material 130 is provided over the carrier 101 to encapsulate the semiconductor device 110. In some embodiments, the encapsulating material 130 may include a molding compound, an epoxy, or a resin, etc. In some embodiments, a top surface of the encapsulating material 130 may be higher than the top surface of the dielectric layer 116a. Namely, the encapsulating material 130 covers the top surface of the dielectric layer 116a.

Then, a thinning process, which includes a grinding process, may be performed to thin the encapsulating material 130 (and the dielectric layer 116a) until the top surfaces of the conductive vias 114 are revealed. The resulting structure is shown in FIG. 21. Due to the thinning process, the top surfaces of the conductive vias 114 are substantially level with the top surface of the encapsulating material 130 and the top surface of the dielectric layer 116 as shown in FIG. 21. Throughout the description, the resultant structure including the semiconductor device 110, and the encapsulating material 130 as shown in FIG. 21 is referred to as an encapsulated semiconductor device 105, which may have a wafer form in the process.

Figure 22:
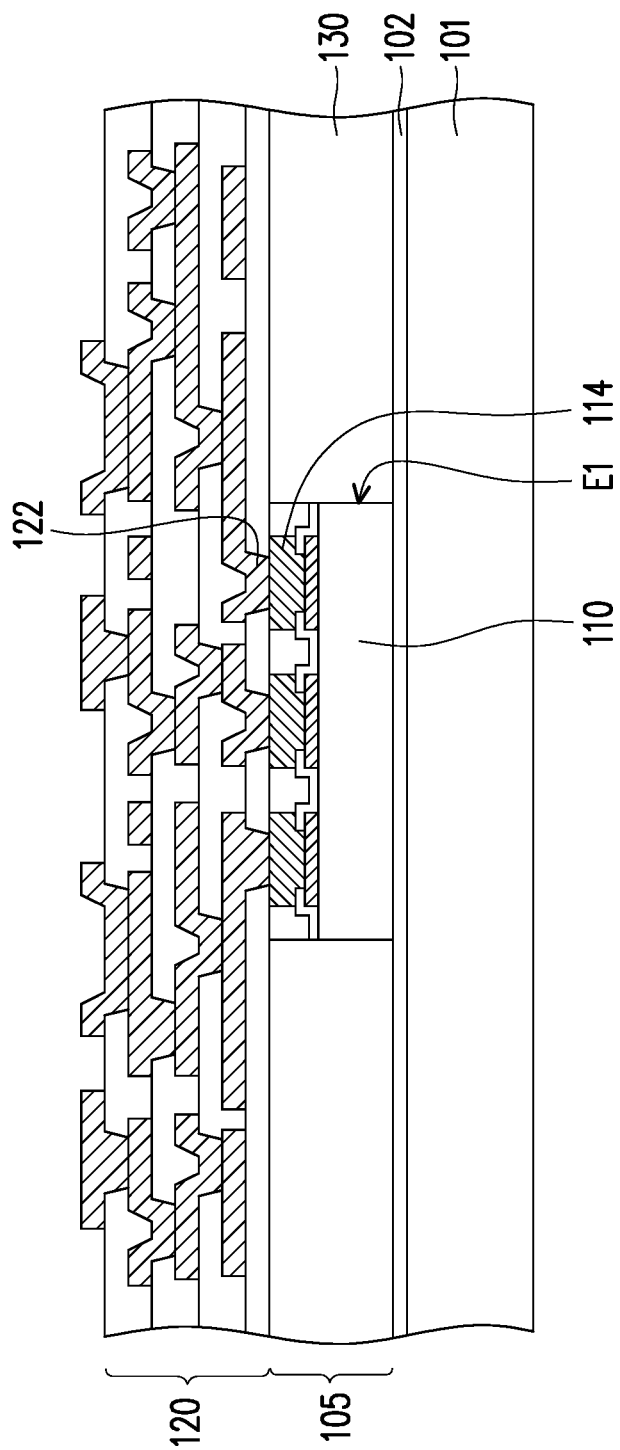

Next, referring to FIG. 5 and FIG. 22, a redistribution structure 120 is formed over the semiconductor device 110 and the encapsulating material 130. The redistribution structure 120 is electrically connected to the semiconductor device 110. In some embodiments, the redistribution structure 120 are formed over the encapsulated semiconductor device 105 to connect to the conductive vias 114 of the semiconductor device 110. In the present embodiment, the conductive vias 114 of the semiconductor device 110 may be seen as the conductive bump 150 in the previous embodiments, which connects the via 122 of the redistribution structure 120. In one embodiment, the redistribution structure 120 is in contact with the conductive vias 114 and the dielectric layer 116 of the semiconductor device 110 and the encapsulating material 130 without any underfill or bumps disposed in between. In some embodiments, the redistribution structure 120 may be formed by depositing conductive layers, patterning the conductive layers to form a plurality of redistribution lines (e.g., redistribution lines 125, 128, 1222), and at least one conductive line (e.g., conductive lines 123, 127). The redistribution lines and the conductive lines are at least partially covered with dielectric layers (e.g., dielectric layers 1221, 1241, 1261 shown in FIG. 5) and the dielectric layers fill the gaps between the redistribution lines and the conductive lines. The vias (e.g., vias 122, 124, 126) are located on the layers of the redistribution structure 120 respectively and extending through the corresponding dielectric layers for interconnecting the redistribution lines and the conductive lines at different layers. The material of the redistribution lines and the conductive lines may include a metal or a metal alloy including aluminum, copper, tungsten, and/or alloys thereof.

In detail, a seed layer, such as a copper, titanium, or the like, may be deposited over the carrier 101, such as by sputtering or another physical vapor deposition (PVD) process. A photo resist is deposited on the seed layer and patterned to expose portions of the seed layer by photolithography. The pattern is for a metallization layer on the redistribution structure 120. Conductive material of the redistribution lines and the conductive lines, such as copper, aluminum, the like, or a combination thereof, is deposited on the exposed seed layer, such as by electroless plating, electroplating, or the like. The photoresist is removed by an ash and/or flush process. The exposed seed layer removed, such as by a wet or dry etch. The remaining conductive material forms a metallization layer (e.g., the redistribution lines 125, 128, 1222 and the conductive lines 123, 127 shown in FIG. 5) of the redistribution structure 120. A dielectric layer (e.g., dielectric layers 1221, 1241, 1261 shown in FIG. 5) is deposited over the metallization layer. The material of the dielectric layer may include polymer such as a polyimide, polybenzoxazole (PBO), benzocyclobutene (BCB), the like, or a combination thereof. The dielectric layer can be deposited by a coating process, a lamination process, the like, or a combination thereof. Vias (e.g., vias 122, 124, 126 shown in FIG. 5) may be formed through the dielectric layer to the metallization layer using acceptable photolithography techniques.

Subsequent metallization layers and dielectric layers may be formed using the same or similar processes as discussed. Conductive material deposited during the formation of a subsequent metallization layer may be deposited in openings of the previously formed dielectric layers to form vias for electrically connecting respective metallization layers. After forming the topmost dielectric layer 1221, via 122 is formed through the topmost dielectric layer 1221 for connectors coupled between the redistribution lines 125, and another semiconductor device, package, die, and/or another substrate. It should be noted that any number of metallization layers and dielectric layers may be formed, and the redistribution structure 120 in this embodiment is illustrated as an example.

As illustrated in FIG. 3 and FIG. 7, in some embodiments, the redistribution structure 120 includes the vias 122, 126, 124 connected to one another through the conductive lines 123, 127. In addition, from a top view, an angle θ is included between the conductive line 123 and the redistribution line 125, and the included angle θ is greater than zero. In other words, the conductive line 123 and the redistribution line 125 are not parallel or collinear to each other. In the embodiment of the redistribution structure 120 having multiple conductive lines for connecting the vias, an angle θ1 is included between adjacent two of the conductive lines 123, 127 from a top view, and the angle θ1 is greater than zero. That is, the adjacent two of the conductive lines 123, 127 are not parallel to or collinear with one another. In some embodiments, the angle θ1 ranges substantially from about 20 degrees to about 90 degrees. In addition, an Under Bump Metallurgy (UBM) layer may be formed on the redistribution structure 120 by sputtering, evaporation, or electroless plating, etc.

With such arrangement, compared to the conductive line(s) and the redistribution line 125 being parallel or collinear to each other, the stress on the redistribution line 125 may transmit through and distribute over the vias 122/124/126, conductive line(s) 123/127. In other words, during the thermal cycling, certain thermal stress between the redistribution line and the semiconductor device may be released through the change of the angle θ/θ1 between the conductive lines, and additional layers of dielectric layers (added for forming the at least one vias) also provide more flexibility to the redistribution structure. Thereby, such arrangement may help to reduce stress on the redistribution line 125 during thermal cycling (heating process), and increase reliability of the redistribution line 125 of a semiconductor package such as the integrated fan-out (InFO) package shown herein.

Figure 23:
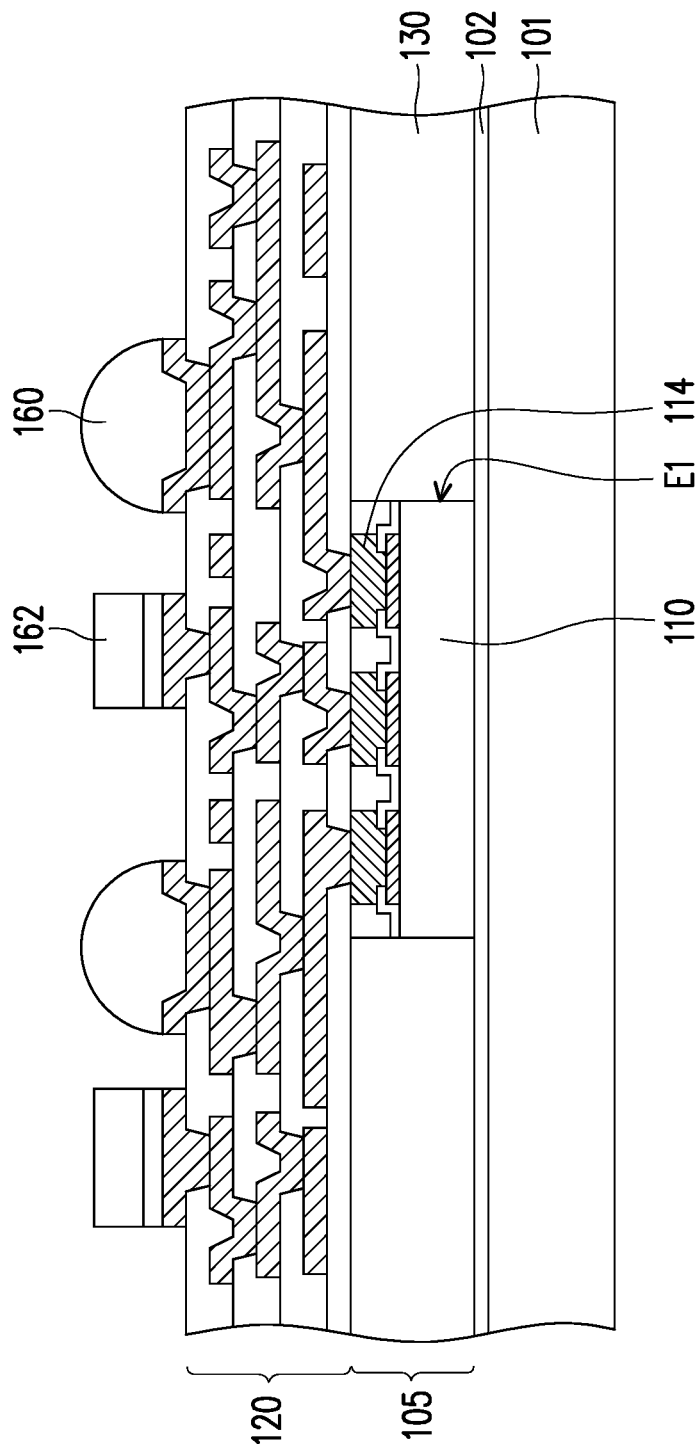

Referring to FIG. 23, a plurality of connectors 160 are disposed on the redistribution structure 120 in accordance with some exemplary embodiments. In some embodiments, at least one integrated passive device (IPD) 162 may also be disposed on the redistribution structure 120. In some embodiments, the connectors 160 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 160 may include a conductive material such as solder, copper, aluminum, gold, nickel, silver, palladium, tin, the like, or a combination thereof. In some embodiments, the connectors 160 include a eutectic material and may comprise a solder bump or a solder ball, as examples. In some embodiments, a reflow process may be performed, giving the connectors 160 a shape of a partial sphere in some embodiments. Alternatively, the connectors 160 may comprise other shapes. The connectors 160 may also comprise non-spherical conductive connectors, for example. In some embodiments, the connectors 160 include metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls. In the present embodiment, the connectors are C4 bumps, but the disclosure is not limited thereto. The formation of the connectors 160 may include placing solder balls on the redistribution structure 120, and then reflowing the solder balls. In alternative embodiments, the formation of the connectors 160 may include performing a plating process to form solder regions on the redistribution structure 120, and then reflowing the solder regions. The connectors 160 may also include conductive pillars, or conductive pillars with solder caps, which may also be formed through plating. The IPD 162 may be fabricated using standard wafer fabrication technologies such as thin film and photolithography processing, and may be mounted on the redistribution structure 120 through, for example, flip-chip bonding or wire bonding, etc.

Figure 24:
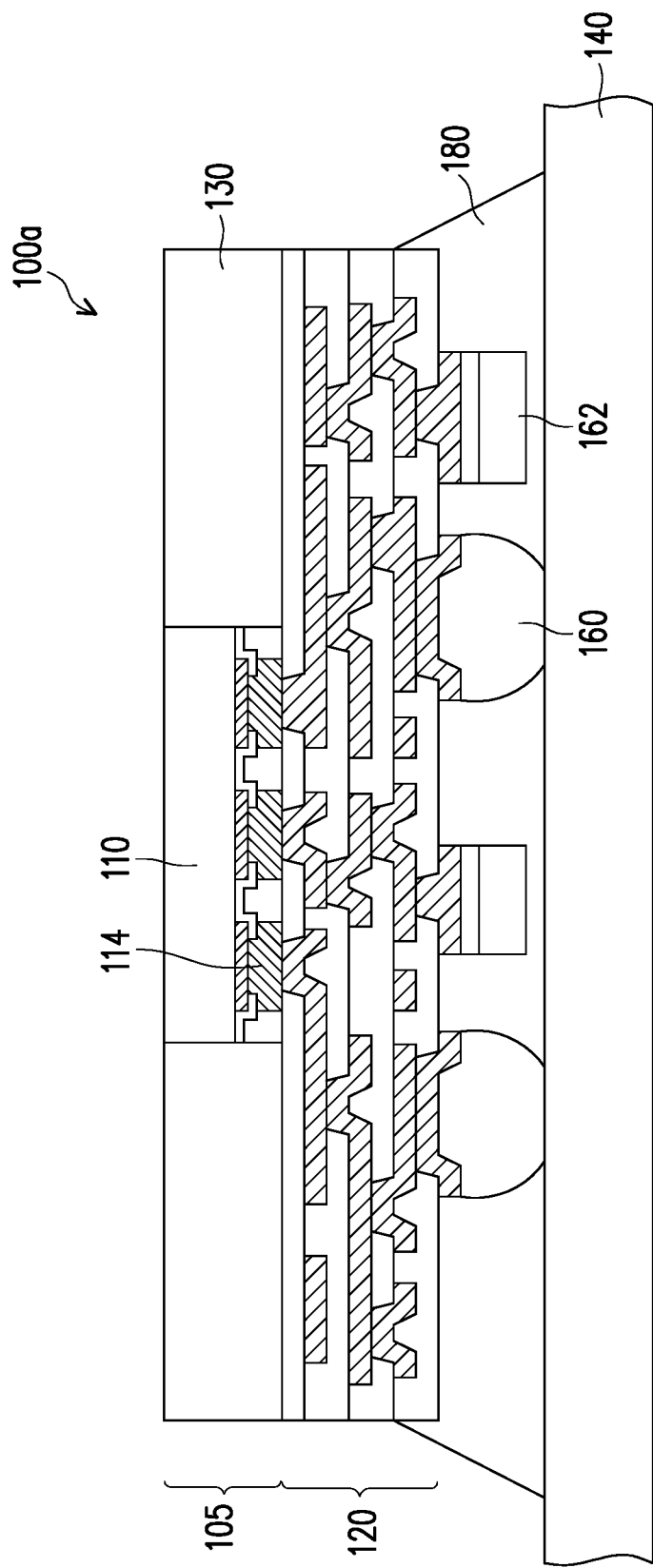

Next, referring to FIG. 24, a demounting step is performed to remove the carrier 101 from the encapsulated semiconductor device 105. In some embodiments, the carrier 101 is detached from the encapsulated semiconductor device 105 by causing the adhesive layer 102 to lose or reduce adhesion. The adhesive layer 102 is then removed along with the carrier 101. For example, the adhesive layer 102 may be exposed to UV light, so that the adhesive layer 102 loses or reduces adhesion, and hence the carrier 101 and the adhesive layer 102 can be removed from the package structure PK.

Then, the resultant structure (including the encapsulated semiconductor device 105 and the redistribution structure 120) may be mounted (e.g., frame mounted) onto a dicing tape (e.g., the dicing tape shown in FIG. 18). Following this, the resultant structure may be singulated or diced (e.g., along dicing line DL), thereby forming a plurality of packages, each of which may be substantially identical to the package shown in FIG. 24. Then, the diced package is bonded to a substrate 140 through the connectors 160. At this point, the semiconductor package 100a shown in FIG. 24 may be substantially formed. In some embodiments, the diced package is mounted by way of the connectors 160 to the substrate 140, which may be a package, a die, a PCB, a chip, or another surface. Additionally, while not shown, additional dies may be, in some embodiments, mounted on the substrate 140 and are in electrical communication with the diced package through the substrate 140. The substrate 140, in some embodiments, is based on an insulating core, such as a glass fiber reinforced resin core. An exemplary core material is glass fiber resin, such as FR4. Alternatives to the core material are bismaleimide-triazine (BT) resin or, alternatively, other printed circuit board (PCB) materials or layers. In addition, for the substrate 140, laminated layers such as an Ajinomoto make coat (ABF) or other laminates may be used. In an alternative embodiment, the substrate 140 may be made of a semiconductor material such as silicon, germanium, diamond or the like. In some embodiments, composite materials may also be used, such as silicon germanium, silicon carbide, gallium arsenic, indium arsenide, indium phosphide, silicon germanium carbide, gallium arsenic phosphide, gallium indium phosphide, combinations thereof, and the like. In addition, the substrate 140 can be a silicon on insulator substrate (SOI substrate). Typically, an SOI substrate comprises a layer of a semiconductor material, such as epitaxial silicon, germanium, silicon germanium, SOI, silicon germanium on insulator (SGOI), or combinations thereof.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes an encapsulated semiconductor device and a redistribution structure. The encapsulated semiconductor device includes a semiconductor device encapsulated by an encapsulating material. The redistribution structure overlays the encapsulated semiconductor device and includes a plurality of vias and a redistribution line. The plurality of vias are located on different layers of the redistribution structure respectively and connected to one another through a plurality of conductive lines, wherein, from a top view, an angle greater than zero is included between adjacent two of the plurality of conductive lines. The redistribution line is disposed under the plurality of conductive lines and connects corresponding one of the plurality of vias and electrically connected to the semiconductor device through the plurality of vias.

In accordance with some embodiments of the disclosure, a semiconductor package includes a semiconductor device and a redistribution structure. The redistribution structure overlays the semiconductor device and includes a first conductive line, a first via, a redistribution line, and a second via. The first via connects between the semiconductor device and the first conductive line. The second via connects between the first conductive line and the redistribution line, wherein, from a top view, an included angle greater than zero is included between the first conductive line and the redistribution line.

In accordance with some embodiments of the disclosure, a manufacturing method of a semiconductor package, includes the following steps. A redistribution structure is formed, wherein the redistribution structure includes a plurality of vias connected to one another through a plurality of conductive lines and a redistribution line connected to the semiconductor device through the plurality of vias, and, from a top view, an angle greater than zero is included between adjacent two of the plurality of conductive lines. A semiconductor device is bonded on a first side of the redistribution structure. An encapsulating material is provided over the redistribution structure to encapsulate the semiconductor device. A substrate is bonded to a second side of the redistribution structure opposite to the first side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
an encapsulated semiconductor device comprising a semiconductor device encapsulated by an encapsulating material; and
a redistribution structure overlying the encapsulated semiconductor device and comprising:
a plurality of vias located on different layers of the redistribution structure respectively and connected to one another through a plurality of conductive lines, wherein, from a top view, an angle greater than zero is included between adjacent two of the plurality of conductive lines; and
a redistribution line disposed under the plurality of conductive lines and connecting corresponding one of the plurality of vias and electrically connected to the semiconductor device through the plurality of vias.

2. The semiconductor package as claimed in claim 1, further comprising a plurality of conductive bumps bonded between the semiconductor device and the redistribution structure, and one of the plurality of conductive bumps is bonded to an uppermost one of the plurality of vias.

3. The semiconductor package as claimed in claim 2, wherein the one of the plurality of conductive bumps is closest to an edge of the semiconductor device.

4. The semiconductor package as claimed in claim 1, further comprising a substrate and a plurality connectors, wherein the redistribution structure is bonded to the substrate through the plurality of connectors.

5. The semiconductor package as claimed in claim 1, wherein the angle ranges substantially from 20° to 90°.

6. The semiconductor package as claimed in claim 1, wherein the plurality of vias do not overlap with one another from a top view.

7. The semiconductor package as claimed in claim 1, wherein a shortest horizontal distance between one of the plurality of vias bonded to the semiconductor device and a closest edge of the semiconductor device is shorter than a shortest horizontal distance between one of the plurality of vias connecting the redistribution line and the closest edge of the semiconductor device.

8. The semiconductor package as claimed in claim 1, wherein, from a top view, an included angle greater than zero is included between one of the plurality of conductive lines and the redistribution line.

9. A semiconductor package, comprising:
a semiconductor device; and
a redistribution structure overlying the semiconductor device and comprising:
a plurality of vias located on different layers of the redistribution structure respectively and connected to one another through a plurality of conductive lines; and a redistribution line disposed under the plurality of conductive lines and connecting corresponding one of the plurality of vias, wherein, from a top view, an included angle greater than zero is included between one of the plurality of conductive lines and the redistribution line.

10. The semiconductor package as claimed in claim 9, further comprising a plurality of conductive bumps bonded between the semiconductor device and the redistribution structure, and one of the plurality of conductive bumps is bonded to an uppermost one of the plurality of vias.

11. The semiconductor package as claimed in claim 9, further comprising a substrate and a plurality connectors, wherein the redistribution structure is bonded to the substrate through the plurality of connectors.

12. The semiconductor package as claimed in claim 9, wherein
an angle greater than zero is included between adjacent two of the plurality of conductive lines.

13. The semiconductor package as claimed in claim 12, wherein the angle ranges substantially from 20° to 90°.

14. The semiconductor package as claimed in claim 9, wherein the plurality of vias do not overlap with one another from a top view.

15. The semiconductor package as claimed in claim 9, further comprising an encapsulating material disposed over the redistribution structure and encapsulating the semiconductor device.

16. The semiconductor package as claimed in claim 9, wherein a horizontal distance between an uppermost one of the plurality of vias, which is vertically closest to the semiconductor device, and a closest edge of the semiconductor device is shorter than a horizontal distance between a bottommost one of the plurality of vias, which is vertically closest to the redistribution line, and the closest edge of the semiconductor device.

17. A semiconductor package, comprising:
a semiconductor device; and
a redistribution structure over the semiconductor device and comprising:
a plurality of vias located on different layers of the redistribution structure respectively and connected to one another through a plurality of conductive lines, wherein, from a top view, an angle greater than zero is included between adjacent two of the plurality of conductive lines; and
a redistribution line disposed under the plurality of conductive lines electrically connected to the semiconductor device through the plurality of vias.

18. The semiconductor package as claimed in claim 17, wherein an angle greater than zero is included between adjacent two of the plurality of conductive lines.

19. The semiconductor package as claimed in claim 18, wherein the angle ranges substantially from 20° to 90°.

20. The semiconductor package as claimed in claim 17, wherein a horizontal distance between an uppermost one of the plurality of vias, which is vertically closest to the semiconductor device, and a closest edge of the semiconductor device is shorter than a horizontal distance between a bottommost one of the plurality of vias, which is vertically closest to the redistribution line, and the closest edge of the semiconductor device.

* * * * *